(12) United States Patent
Wilberding et al.

(10) Patent No.: US 9,668,049 B2
(45) Date of Patent: May 30, 2017

(54) PLAYBACK DEVICE CALIBRATION USER INTERFACES

(71) Applicant: Sonos, Inc., Santa Barbara, CA (US)

(72) Inventors: Dayn Wilberding, Santa Barbara, CA (US); Timothy Sheen, Brighton, MA (US)

(73) Assignee: Sonos, Inc., Santa Barbara, CA (US)

( * ) Notice: Subject to any disclaimer, the term of this patent is extended or adjusted under 35 U.S.C. 154(b) by 21 days.

(21) Appl. No.: 14/826,856

(22) Filed: Aug. 14, 2015

(65) Prior Publication Data

US 2016/0014512 A1 Jan. 14, 2016

Related U.S. Application Data

(63) Continuation-in-part of application No. 14/696,014, filed on Apr. 24, 2015.

(51) Int. Cl.
*H04R 29/00* (2006.01)
*H04R 3/04* (2006.01)
(Continued)

(52) U.S. Cl.
CPC .............. *H04R 3/04* (2013.01); *G06F 3/165* (2013.01); *H03G 9/005* (2013.01); *H03G 9/025* (2013.01); *H04R 1/24* (2013.01); *H04R 27/00* (2013.01); *H04S 7/301* (2013.01); *H04R 2227/005* (2013.01)

(58) Field of Classification Search
CPC .. H04R 3/04; H04R 1/24; H04R 27/00; G06F 3/165; H03G 9/005; H04S 7/302
See application file for complete search history.

(56) References Cited

U.S. PATENT DOCUMENTS 4,306,113 A 12/1981 Morton
4,342,104 A 7/1982 Jack
(Continued)

FOREIGN PATENT DOCUMENTS

EP 0772374 A2 5/1997
EP 1133896 B1 8/2002
(Continued)

OTHER PUBLICATIONS

"AudioTron Quick Start Guide, Version 1.0", Voyetra Turtle Beach, Inc., Mar. 2001, 24 pages.
(Continued)

*Primary Examiner* — Regina N Holder
(74) *Attorney, Agent, or Firm* — McDonnell Boehnen Hulbert & Berghoff LLP

(57) ABSTRACT

Examples described herein involve providing playback device calibration user interfaces to guide a calibration process for one or more playback devices in a playback environment. In one example, providing the user interfaces involves receiving audio data from the microphone for a predetermined duration of time, and while receiving the audio data, dynamically providing for display on a graphical interface, (i) representations of frequency responses determined based on audio data that have been received from the microphone, and (ii) representations of times within the predetermined duration of time that correspond to the displayed representations of frequency responses.

20 Claims, 9 Drawing Sheets

(51) Int. Cl.
*H04R 1/24* (2006.01)
*G06F 3/16* (2006.01)
*H04R 27/00* (2006.01)
*H04S 7/00* (2006.01)
*H03G 9/00* (2006.01)
*H03G 9/02* (2006.01)

(56) References Cited

U.S. PATENT DOCUMENTS

| | | |
|---|---|---|
| 4,504,704 A | 3/1985 | Ohyaba et al. |
| 4,592,088 A | 5/1986 | Shimada |
| 4,631,749 A | 12/1986 | Rapaich |
| 4,694,484 A | 9/1987 | Atkinson et al. |
| 4,995,778 A | 2/1991 | Bruessel |
| 5,218,710 A | 6/1993 | Yamaki et al. |
| 5,255,326 A | 10/1993 | Stevenson |
| 5,323,257 A | 6/1994 | Abe et al. |
| 5,386,478 A | 1/1995 | Plunkett |
| 5,440,644 A | 8/1995 | Farinelli et al. |
| 5,553,147 A | 9/1996 | Pineau |
| 5,581,621 A | 12/1996 | Koyama et al. |
| 5,761,320 A | 6/1998 | Farinelli et al. |
| 5,910,991 A | 6/1999 | Farrar |
| 5,923,902 A | 7/1999 | Inagaki |
| 6,032,202 A | 2/2000 | Lea et al. |
| 6,111,957 A | 8/2000 | Thomasson |
| 6,256,554 B1 | 7/2001 | DiLorenzo |
| 6,404,811 B1 | 6/2002 | Cvetko et al. |
| 6,469,633 B1 | 10/2002 | Wachter |
| 6,522,886 B1 | 2/2003 | Youngs et al. |
| 6,573,067 B1 | 6/2003 | Dib-Hajj et al. |
| 6,611,537 B1 | 8/2003 | Edens et al. |
| 6,631,410 B1 | 10/2003 | Kowalski et al. |
| 6,639,989 B1 | 10/2003 | Zacharov et al. |
| 6,643,744 B1 | 11/2003 | Cheng |
| 6,704,421 B1 | 3/2004 | Kitamura |
| 6,721,428 B1 | 4/2004 | Allred et al. |
| 6,757,517 B2 | 6/2004 | Chang |
| 6,766,025 B1 | 7/2004 | Levy et al. |
| 6,778,869 B2 | 8/2004 | Champion |
| 6,798,889 B1 | 9/2004 | Dicker et al. |
| 6,862,440 B2 | 3/2005 | Sampath |
| 6,916,980 B2 | 7/2005 | Ishida et al. |
| 6,931,134 B1 | 8/2005 | Waller, Jr. et al. |
| 6,985,694 B1 | 1/2006 | De Bonet et al. |
| 6,990,211 B2 | 1/2006 | Parker |
| 7,039,212 B2 | 5/2006 | Poling et al. |
| 7,058,186 B2 | 6/2006 | Tanaka |
| 7,072,477 B1 | 7/2006 | Kincaid |
| 7,103,187 B1 | 9/2006 | Neuman |
| 7,130,608 B2 | 10/2006 | Hollstrom et al. |
| 7,130,616 B2 | 10/2006 | Janik |
| 7,143,939 B2 | 12/2006 | Henzerling |
| 7,187,947 B1 | 3/2007 | White et al. |
| 7,236,773 B2 | 6/2007 | Thomas |
| 7,289,637 B2 | 10/2007 | Montag et al. |
| 7,295,548 B2 | 11/2007 | Blank et al. |
| 7,312,785 B2 | 12/2007 | Tsuk et al. |
| 7,477,751 B2 | 1/2009 | Lyon et al. |
| 7,483,538 B2 | 1/2009 | McCarty et al. |
| 7,483,540 B2 | 1/2009 | Rabinowitz et al. |
| 7,489,784 B2 | 2/2009 | Yoshino |
| 7,490,044 B2 | 2/2009 | Kulkarni |
| 7,492,909 B2 | 2/2009 | Carter et al. |
| 7,519,188 B2 | 4/2009 | Berardi et al. |
| 7,529,377 B2 | 5/2009 | Nackvi et al. |
| 7,571,014 B1 | 8/2009 | Lambourne et al. |
| 7,590,772 B2 | 9/2009 | Marriott et al. |
| 7,630,500 B1 | 12/2009 | Beckman et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,664,276 B2 | 2/2010 | McKee Cooper |
| 7,676,044 B2 | 3/2010 | Sasaki et al. |
| 7,689,305 B2 | 3/2010 | Kreifeldt et al. |
| 7,742,740 B2 | 6/2010 | Goldberg et al. |
| 7,769,183 B2 | 8/2010 | Bharitkar et al. |
| 7,796,068 B2 | 9/2010 | Raz et al. |
| 7,835,689 B2 | 11/2010 | Goldberg et al. |
| 7,853,341 B2 | 12/2010 | McCarty et al. |
| 7,925,203 B2 | 4/2011 | Lane et al. |
| 7,949,140 B2 | 5/2011 | Kino |
| 7,949,707 B2 | 5/2011 | Mcdowall et al. |
| 7,961,893 B2 | 6/2011 | Kino |
| 7,987,294 B2 | 7/2011 | Bryce et al. |
| 8,005,228 B2 | 8/2011 | Bharitkar et al. |
| 8,014,423 B2 | 9/2011 | Thaler et al. |
| 8,045,721 B2 | 10/2011 | Burgan et al. |
| 8,045,952 B2 | 10/2011 | Qureshey et al. |
| 8,050,652 B2 | 11/2011 | Qureshey et al. |
| 8,063,698 B2 | 11/2011 | Howard |
| 8,074,253 B1 | 12/2011 | Nathan |
| 8,103,009 B2 | 1/2012 | Mccarty et al. |
| 8,116,476 B2 | 2/2012 | Inohara |
| 8,126,172 B2 | 2/2012 | Horbach et al. |
| 8,131,390 B2 | 3/2012 | Braithwaite et al. |
| 8,139,774 B2 | 3/2012 | Berardi et al. |
| 8,144,883 B2 | 3/2012 | Pdersen et al. |
| 8,160,276 B2 | 4/2012 | Liao et al. |
| 8,160,281 B2 | 4/2012 | Kim et al. |
| 8,170,260 B2 | 5/2012 | Reining et al. |
| 8,175,292 B2 | 5/2012 | Aylward et al. |
| 8,175,297 B1 | 5/2012 | Ho et al. |
| 8,194,874 B2 | 6/2012 | Starobin et al. |
| 8,229,125 B2 | 7/2012 | Short |
| 8,233,632 B1 | 7/2012 | Macdonald et al. |
| 8,234,395 B2 | 7/2012 | Millington et al. |
| 8,238,547 B2 | 8/2012 | Ohki et al. |
| 8,238,578 B2 | 8/2012 | Aylward |
| 8,243,961 B1 | 8/2012 | Morrill |
| 8,265,310 B2 | 9/2012 | Berardi et al. |
| 8,270,620 B2 | 9/2012 | Christensen |
| 8,279,709 B2 | 10/2012 | Choisel et al. |
| 8,281,001 B2 | 10/2012 | Busam et al. |
| 8,290,185 B2 | 10/2012 | Kim |
| 8,291,349 B1 | 10/2012 | Park et al. |
| 8,300,845 B2 | 10/2012 | Zurek et al. |
| 8,306,235 B2 | 11/2012 | Mahowald |
| 8,325,931 B2 | 12/2012 | Howard et al. |
| 8,325,935 B2 | 12/2012 | Rutschman |
| 8,331,585 B2 | 12/2012 | Hagen et al. |
| 8,332,414 B2 | 12/2012 | Nguyen et al. |
| 8,391,501 B2 | 3/2013 | Khawand et al. |
| 8,401,202 B2 | 3/2013 | Brooking |
| 8,433,076 B2 | 4/2013 | Zurek et al. |
| 8,452,020 B2 | 5/2013 | Gregg et al. |
| 8,463,184 B2 | 6/2013 | Dua |
| 8,483,853 B1 | 7/2013 | Lambourne |
| 8,488,799 B2 | 7/2013 | Goldstein et al. |
| 8,503,669 B2 | 8/2013 | Mao |
| 8,527,876 B2 | 9/2013 | Wood et al. |
| 8,577,045 B2 | 11/2013 | Gibbs |
| 8,577,048 B2 | 11/2013 | Chaikin et al. |
| 8,600,075 B2 | 12/2013 | Lim |
| 8,620,006 B2 | 12/2013 | Berardi et al. |
| 8,731,206 B1 | 5/2014 | Park |
| 8,755,538 B2 | 6/2014 | Kwon |
| 8,819,554 B2 | 8/2014 | Basso et al. |
| 8,831,244 B2 | 9/2014 | Apfel |
| 8,855,319 B2 | 10/2014 | Liu et al. |
| 8,879,761 B2 | 11/2014 | Johnson et al. |
| 8,903,526 B2 | 12/2014 | Beckhardt et al. |
| 8,914,559 B2 | 12/2014 | Kalayjian et al. |
| 8,930,005 B2 | 1/2015 | Reimann |
| 8,934,647 B2 | 1/2015 | Joyce et al. |
| 8,934,655 B2 | 1/2015 | Breen et al. |
| 8,965,033 B2 | 2/2015 | Wiggins |
| 8,965,546 B2 | 2/2015 | Visser et al. |
| 8,977,974 B2 | 3/2015 | Kraut |
| 8,984,442 B2 | 3/2015 | Pirnack et al. |
| 8,989,406 B2 | 3/2015 | Wong et al. |
| 8,995,687 B2 | 3/2015 | Marino, Jr. et al. |
| 8,996,370 B2 | 3/2015 | Ansell |
| 9,020,153 B2 | 4/2015 | Britt, Jr. |

(56) References Cited

U.S. PATENT DOCUMENTS

| | | |
|---|---|---|
| 9,084,058 B2 | 7/2015 | Reilly et al. |
| 9,100,766 B2 | 8/2015 | Soulodre |
| 9,106,192 B2 | 8/2015 | Sheen et al. |
| 9,215,545 B2 | 12/2015 | Dublin et al. |
| 9,219,460 B2 | 12/2015 | Bush |
| 9,288,597 B2 | 3/2016 | Carlsson et al. |
| 9,300,266 B2 | 3/2016 | Grokop |
| 9,319,816 B1 | 4/2016 | Narayanan |
| 9,467,779 B2 | 10/2016 | Iyengar et al. |
| 9,472,201 B1 | 10/2016 | Sleator |
| 9,489,948 B1 | 11/2016 | Chu et al. |
| 2001/0042107 A1 | 11/2001 | Palm |
| 2001/0043592 A1 | 11/2001 | Jimenez et al. |
| 2002/0022453 A1 | 2/2002 | Balog et al. |
| 2002/0026442 A1 | 2/2002 | Lipscomb et al. |
| 2002/0078161 A1 | 6/2002 | Cheng |
| 2002/0089529 A1 | 7/2002 | Robbin |
| 2002/0124097 A1 | 9/2002 | Isely et al. |
| 2003/0002689 A1 | 1/2003 | Folio |
| 2003/0157951 A1 | 8/2003 | Hasty |
| 2003/0161479 A1 | 8/2003 | Yang et al. |
| 2003/0179891 A1 | 9/2003 | Rabinowitz et al. |
| 2004/0024478 A1 | 2/2004 | Hans et al. |
| 2004/0237750 A1 | 12/2004 | Smith et al. |
| 2005/0031143 A1 | 2/2005 | Devantier et al. |
| 2005/0063554 A1 | 3/2005 | Devantier et al. |
| 2005/0147261 A1 | 7/2005 | Yeh |
| 2005/0157885 A1 | 7/2005 | Olney et al. |
| 2006/0008256 A1 | 1/2006 | Khedouri et al. |
| 2006/0026521 A1 | 2/2006 | Hotelling et al. |
| 2006/0032357 A1 | 2/2006 | Roovers et al. |
| 2006/0195480 A1 | 8/2006 | Spiegelman et al. |
| 2006/0225097 A1 | 10/2006 | Lawrence-Apfelbaum |
| 2007/0003067 A1 | 1/2007 | Gierl et al. |
| 2007/0032895 A1* | 2/2007 | Nackvi .............. H04R 5/00 700/94 |
| 2007/0038999 A1 | 2/2007 | Millington et al. |
| 2007/0086597 A1 | 4/2007 | Kino |
| 2007/0121955 A1 | 5/2007 | Johnston et al. |
| 2007/0142944 A1 | 6/2007 | Goldberg et al. |
| 2008/0002839 A1 | 1/2008 | Eng |
| 2008/0069378 A1 | 3/2008 | Rabinowitz et al. |
| 2008/0098027 A1 | 4/2008 | Aarts |
| 2008/0136623 A1 | 6/2008 | Calvarese |
| 2008/0144864 A1 | 6/2008 | Huon |
| 2008/0175411 A1 | 7/2008 | Greve |
| 2009/0024662 A1 | 1/2009 | Park et al. |
| 2009/0047993 A1 | 2/2009 | Vasa |
| 2009/0063274 A1 | 3/2009 | Dublin, III et al. |
| 2009/0110218 A1 | 4/2009 | Swain |
| 2009/0138507 A1 | 5/2009 | Burckart et al. |
| 2009/0147134 A1 | 6/2009 | Iwamatsu |
| 2009/0196428 A1 | 8/2009 | Kim |
| 2009/0252481 A1 | 10/2009 | Ekstrand |
| 2009/0304205 A1 | 12/2009 | Hardacker et al. |
| 2010/0128902 A1 | 5/2010 | Liu et al. |
| 2010/0135501 A1 | 6/2010 | Corbett et al. |
| 2010/0142735 A1 | 6/2010 | Yoon et al. |
| 2010/0146445 A1 | 6/2010 | Kraut |
| 2010/0162117 A1 | 6/2010 | Basso et al. |
| 2010/0195846 A1 | 8/2010 | Yokoyama |
| 2010/0272270 A1 | 10/2010 | Chaikin et al. |
| 2010/0296659 A1 | 11/2010 | Tanaka |
| 2010/0323793 A1 | 12/2010 | Andall |
| 2011/0007904 A1 | 1/2011 | Tomoda et al. |
| 2011/0007905 A1 | 1/2011 | Sato et al. |
| 2011/0087842 A1 | 4/2011 | Lu et al. |
| 2011/0091055 A1 | 4/2011 | Leblanc |
| 2011/0170710 A1 | 7/2011 | Son |
| 2011/0234480 A1 | 9/2011 | Fino et al. |
| 2012/0051558 A1 | 3/2012 | Kim et al. |
| 2012/0057724 A1 | 3/2012 | Rabinowitz et al. |
| 2012/0127831 A1 | 5/2012 | Gicklhorn et al. |
| 2012/0148075 A1 | 6/2012 | Goh et al. |
| 2012/0183156 A1 | 7/2012 | Schlessinger et al. |
| 2012/0243697 A1 | 9/2012 | Frye |
| 2012/0263325 A1 | 10/2012 | Freeman et al. |
| 2012/0268145 A1 | 10/2012 | Chandra et al. |
| 2012/0283593 A1 | 11/2012 | Searchfield et al. |
| 2012/0288124 A1 | 11/2012 | Fejzo et al. |
| 2013/0010970 A1 | 1/2013 | Hegarty et al. |
| 2013/0028443 A1 | 1/2013 | Pance et al. |
| 2013/0051572 A1 | 2/2013 | Goh et al. |
| 2013/0066453 A1 | 3/2013 | Seefeldt |
| 2013/0108055 A1 | 5/2013 | Hanna et al. |
| 2013/0129122 A1 | 5/2013 | Johnson et al. |
| 2013/0202131 A1 | 8/2013 | Kemmochi et al. |
| 2013/0211843 A1 | 8/2013 | Clarkson |
| 2013/0216071 A1 | 8/2013 | Maher et al. |
| 2013/0223642 A1 | 8/2013 | Warren et al. |
| 2013/0230175 A1 | 9/2013 | Bech et al. |
| 2013/0259254 A1 | 10/2013 | Xiang et al. |
| 2013/0279706 A1 | 10/2013 | Marti |
| 2013/0305152 A1 | 11/2013 | Griffiths et al. |
| 2013/0315405 A1 | 11/2013 | Kanishima et al. |
| 2013/0329896 A1 | 12/2013 | Krishnaswamy et al. |
| 2014/0003622 A1 | 1/2014 | Ikizyan et al. |
| 2014/0003625 A1 | 1/2014 | Sheen et al. |
| 2014/0003626 A1 | 1/2014 | Holman et al. |
| 2014/0016784 A1 | 1/2014 | Sen et al. |
| 2014/0016786 A1 | 1/2014 | Sen |
| 2014/0016802 A1 | 1/2014 | Sen |
| 2014/0023196 A1 | 1/2014 | Xiang et al. |
| 2014/0037097 A1 | 2/2014 | Labosco |
| 2014/0064501 A1 | 3/2014 | Olsen et al. |
| 2014/0079242 A1 | 3/2014 | Nguyen et al. |
| 2014/0112481 A1 | 4/2014 | Li et al. |
| 2014/0126730 A1 | 5/2014 | Crawley et al. |
| 2014/0161265 A1 | 6/2014 | Chaikin et al. |
| 2014/0192986 A1 | 7/2014 | Lee et al. |
| 2014/0219456 A1 | 8/2014 | Morrell et al. |
| 2014/0219483 A1 | 8/2014 | Hong |
| 2014/0226823 A1 | 8/2014 | Sen et al. |
| 2014/0242913 A1 | 8/2014 | Pang |
| 2014/0267148 A1 | 9/2014 | Luna et al. |
| 2014/0270202 A1 | 9/2014 | Ivanov et al. |
| 2014/0270282 A1* | 9/2014 | Tammi .................. H04R 5/02 381/300 |
| 2014/0273859 A1 | 9/2014 | Luna et al. |
| 2014/0279889 A1 | 9/2014 | Luna |
| 2014/0285313 A1 | 9/2014 | Luna et al. |
| 2014/0286496 A1 | 9/2014 | Luna et al. |
| 2014/0294200 A1 | 10/2014 | Baumgarte et al. |
| 2014/0310269 A1 | 10/2014 | Zhang et al. |
| 2014/0321670 A1 | 10/2014 | Nystrom et al. |
| 2014/0323036 A1 | 10/2014 | Daley et al. |
| 2014/0341399 A1 | 11/2014 | Dusse et al. |
| 2014/0344689 A1 | 11/2014 | Scott et al. |
| 2014/0355768 A1 | 12/2014 | Sen et al. |
| 2014/0355794 A1 | 12/2014 | Morrell et al. |
| 2015/0011195 A1 | 1/2015 | Li |
| 2015/0031287 A1 | 1/2015 | Pang et al. |
| 2015/0032844 A1 | 1/2015 | Tarr et al. |
| 2015/0036847 A1 | 2/2015 | Donaldson |
| 2015/0036848 A1 | 2/2015 | Donaldson |
| 2015/0043736 A1 | 2/2015 | Olsen et al. |
| 2015/0063610 A1 | 3/2015 | Mossner |
| 2015/0078586 A1 | 3/2015 | Ang et al. |
| 2015/0078596 A1 | 3/2015 | Sprogis |
| 2015/0092959 A1 | 4/2015 | Agustin et al. |
| 2015/0100991 A1 | 4/2015 | Risberg et al. |
| 2015/0146886 A1 | 5/2015 | Baumgarte |
| 2015/0201274 A1 | 7/2015 | Ellner et al. |
| 2015/0208184 A1 | 7/2015 | Tan et al. |
| 2015/0229699 A1 | 8/2015 | Liu |
| 2015/0281866 A1 | 10/2015 | Williams et al. |
| 2015/0289064 A1 | 10/2015 | Jensen et al. |
| 2015/0382128 A1 | 12/2015 | Ridihalgh et al. |
| 2016/0007116 A1 | 1/2016 | Holman |
| 2016/0014509 A1 | 1/2016 | Hansson et al. |
| 2016/0021458 A1 | 1/2016 | Johnson et al. |
| 2016/0021473 A1 | 1/2016 | Riggi et al. |

(56) References Cited

U.S. PATENT DOCUMENTS

| | | |
|---|---|---|
| 2016/0029142 A1 | 1/2016 | Isaac |
| 2016/0165297 A1 | 6/2016 | Jamal-Syed et al. |
| 2016/0330562 A1 | 11/2016 | Crockett |

FOREIGN PATENT DOCUMENTS

| | | |
|---|---|---|
| EP | 1389853 A1 | 2/2004 |
| EP | 2043381 A2 | 4/2009 |
| EP | 1349427 B1 | 12/2009 |
| EP | 2161950 A2 | 3/2010 |
| EP | 2194471 A1 | 6/2010 |
| EP | 2429155 A1 | 3/2012 |
| EP | 1825713 B1 | 10/2012 |
| EP | 2591617 B1 | 6/2014 |
| EP | 2835989 A2 | 2/2015 |
| EP | 2860992 A1 | 4/2015 |
| KR | 1020060116383 | 11/2006 |
| KR | 1020080011831 | 2/2008 |
| WO | 0153994 A2 | 7/2001 |
| WO | 0182650 | 11/2001 |
| WO | 03093950 A2 | 11/2003 |
| WO | 2004066673 A1 | 8/2004 |
| WO | 2007016465 A2 | 2/2007 |
| WO | 2013016500 A1 | 1/2013 |
| WO | 2015024881 A1 | 2/2015 |
| WO | 2015178950 A1 | 11/2015 |

OTHER PUBLICATIONS

"AudioTron Reference Manual, Version 3.0", Voyetra Turtle Beach, Inc., May 2002, 70 pages.
"AudioTron Setup Guide, Version 3.0", Voyetra Turtle Beach, Inc., May 2002, 38 pages.
Bluetooth. "Specification of the Bluetooth System: The ad hoc SCATTERNET for affordable and highly functional wireless connectivity" Core, Version 1.0 A, Jul. 26, 1999, 1068 pages.
Bluetooth. "Specification of the Bluetooth System: Wireless connections made easy" Core, Version 1.0 B, Dec. 1, 1999, 1076 pages.
"Constellation Acoustic System: a revolutionary breakthrough in acoustical design," Meyer Sound Laboratories, Inc., 2012, 32 pages.
"Constellation Microphones," Meyer Sound Laboratories, Inc., 2013, 2 pages.
Co-pending US patent application No. US201414481505, filed on Sep. 9, 2014.
Co-pending US patent application No. US201414481522, filed on Sep. 9, 2014.
Co-pending US patent application No. US201514696014, filed on Apr. 24, 2015.
Co-pending US patent application No. US201514696366, filed on Apr. 24, 2015.
Co-pending US patent application No. US201514811587, filed on Jul. 28, 2015.
Dell, Inc. "Dell Digital Audio Receiver: Reference Guide" Jun. 2000, 70 pages.
Dell, Inc. "Start Here" Jun. 2000, 2 pages.
Final Office Action mailed on Dec. 18, 2014, issued in connection with U.S. Appl. No. 13/340,126, filed Dec. 29, 2011, 12 pages.
First Action Interview Pilot Program Pre-Interview Communication mailed on Oct. 7, 2015, issued in connection with U.S. Appl. No. 14/216,306, filed Mar. 17, 2014, 5 pages.
International Bureau, International Preliminary Report on Patentability, mailed Sep. 24, 2015, issued in connection with International Application No. PCT/US2014/030560, filed on Mar. 17, 2014, 7 pages.
International Searching Authority, International Search Report and Written Opinion mailed on Jun. 5, 2015, issued in connection with International Application No. PCT/US2015/021000, filed on Mar. 17, 2015, 12 pages.
International Searching Authority, International Search Report and Written Opinion mailed on Jun. 16, 2015, issued in connection with International Application No. PCT/US2015/020993, filed on Mar. 17, 2015, 11 pages.

Jo, J. et al., "Synchronized One-to-many Media Streaming with Adaptive Playout Control," Proceedings of SPIE, 2002, pp. 71-82, vol. 4861.
Jones, Stephen. "Dell Digital Audio Receiver: Digital upgrade for your analog stereo" Analog Stereo. Jun. 24, 2000 retrieved Jun. 18, 2014, 2 pages.
Louderback, Jim. "Affordable Audio Receiver Furnishes Homes With MP3" TechTV Vault. Jun. 28, 2000 retrieved Jul. 10, 2014, 2 pages.
Non-Final Office Action mailed on Jun. 2, 2014, issued in connection with U.S. Appl. No. 13/340,126, filed Dec. 29, 2011, 14 pages.
Non-Final Office Action mailed on Oct. 14, 2015, issued in connection with U.S. Appl. No. 14/216,325, filed Mar. 17, 2014, 7 pages.
Notice of Allowance mailed on Mar. 11, 2015, issued in connection with U.S. Appl. No. 13/340,126, filed Dec. 29, 2011, 7 pages.
Notice of Allowance mailed on Oct. 29, 2015, issued in connection with U.S. Appl. No. 14/216,306, filed Mar. 17, 2014, 9 pages.
Palm, Inc. "Handbook for the Palm VII Handheld" May 2000, 311 pages.
"Presentations at WinHEC 2000" May 2000, 138 pages.
Ross, Alex. "Wizards of Sound: Retouching acoustics, from the restaurant to the concert hall" The New Yorker, Feb. 23, 2015. Web. Feb. 26, 2015.
UPnP; "Universal Plug and Play Device Architecture"; Jun. 8, 2000; version 1.0; Microsoft Corporation; pp. 1-54.
Non-Final Office Action mailed on Dec. 7, 2015, issued in connection with U.S. Appl. No. 14/921,762, filed Oct. 23, 2015, 5 pages.
Notice of Allowance mailed on Dec. 7, 2015, issued in connection with U.S. Appl. No. 14/216,325, filed Mar. 17, 2014, 7 pages.
Burger, Dennis, "Automated Room Correction Explained" hometheaterreview.com, Nov. 18, 2013, Retrieved Oct. 10, 2014, 3 pages.
Daddy, B., "Calibrating Your Audio with a Sound Pressure Level (SPL) Meter," Blue-ray.com, Feb. 22, 2008 Retrieved Oct. 10, 2014, 15 pages.
International Searching Authority, International Search Report and Written Opinion mailed on Nov. 18, 2015, issued in connection with International Application No. PCT/US2015/048954, filed on Sep. 8, 2015, 11 pages.
Microsoft; Corporation., "Using Microsoft Outlook 2003", Cambridge College, 2003.
Motorola., "Simplefi, Wireless Digital Audio Receiver, Installation and User Guide", Dec. 31, 2001, 111 pages.
Mulcahy, John, "Room EQ Wizard: Room Acoustics Software" REW 2014 Retrieved Oct. 10, 2014, 4 pages.
Non-Final Action mailed on Jan. 29, 2016, issued in connection with U.S. Appl. No. 14/481,511, filed Sep. 9, 2014, 10 pages.
Non-Final Office Action mailed on Nov. 21, 2014, issued in connection with U.S. Appl. No. 13/536,493, filed Jun. 28, 2012, 20 pages.
Notice of Allowance mailed on Apr. 10, 2015, issued in connection with U.S. Appl. No. 13/536,493, filed Jun. 28, 2012, 8 pages.
PRISMIQ; Inc., "PRISMIQ Media Player User Guide", 2003, 44 pages.
Non-Final Office Action mailed on Jun. 21, 2016, issued in connection with U.S. Appl. No. 14/678,248, filed Apr. 3, 2015, 10 pages.
Notice of Allowance mailed on Jun. 3, 2016, issued in connection with U.S. Appl. No. 14/921,799, filed Oct. 23, 2015, 8 pages.
Notice of Allowance mailed on Jun. 23, 2016, issued in connection with U.S. Appl. No. 14/921,781, filed Oct. 23, 2015, 8 pages.
International Searching Authority, International Search Report and Written Opinion mailed on Jul. 4, 2016, issued in connection with International Application No. PCT/US2016/028994, filed on Apr. 22, 2016, 12 pages.
International Searching Authority, International Search Report and Written Opinion mailed on Jul. 5, 2016, issued in connection with International Application No. PCT/US2016/028997, filed on Apr. 22, 2016, 13 pages.

(56) References Cited

OTHER PUBLICATIONS

"auEQ for the iPhone," Mar. 25, 2015, retrieved from the internet: URL:https://web.archive.org/web20150325152629/http://www.hotto.de/mobileapps/iphoneaueq.html [retrieved on Jun. 24, 2016], 6 pages.
Non-Final Office Action mailed on Jul. 6, 2016, issued in connection with U.S. Appl. No. 15/070,160, filed Mar. 15, 2016, 6 pages.
Non-Final Office Action mailed on Jul. 7, 2016, issued in connection with U.S. Appl. No. 15/066,049, filed Mar. 10, 2016, 6 pages.
Non-Final Office Action mailed on Jul. 8, 2016, issued in connection with U.S. Appl. No. 15/066,072, filed Mar. 10, 2016, 6 pages.
Non-Final Office Action mailed on Jul. 20, 2016, issued in connection with U.S. Appl. No. 14/682,182, filed Apr. 9, 2015, 13 pages.
Non-Final Office Action mailed on Jul. 27, 2016, issued in connection with U.S. Appl. No. 14/696,014, filed Apr. 24, 2015, 11 pages.
Non-Final Office Action mailed on Jul. 28, 2016, issued in connection with U.S. Appl. No. 14/884,001, filed Oct. 15, 2015, 8 pages.
Notice of Allowance mailed on Jul. 26, 2016, issued in connection with U.S. Appl. No. 14/481,511, filed Sep. 9, 2014, 12 pages.
Non-Final Office Action mailed on Sep. 12, 2016, issued in connection with U.S. Appl. No. 14/811,587, filed Jul. 28, 2015, 24 pages.
Notice of Allowance mailed on Sep. 12, 2016, issued in connection with U.S. Appl. No. 15/066,072, filed Mar. 10, 2016, 7 pages.
First Action Interview Pilot Program Pre-Interview Communication mailed on Feb. 16, 2016, issued in connection with U.S. Appl. No. 14/681,465, filed Apr. 8, 2015, 5 pages.
Notice of Allowance mailed on Feb. 26, 2016, issued in connection with U.S. Appl. No. 14/921,762, filed Oct. 23, 2015, 7 pages.
Notice of Allowance mailed on Apr. 12, 2016, issued in connection with U.S. Appl. No. 14/681,465, filed Apr. 8, 2015, 13 pages.
European Patent Office, Extended European Search Report mailed on Jan. 5, 2017, issued in connection with European Patent Application No. 1576555.6, 8 pages.
European Patent Office, Office Action mailed on Dec. 15, 2016, issued in connection with European Application No. 15766998.7, 7 pages.
First Action Interview Office Action mailed on Jul. 12, 2016, issued in connection with U.S. Appl. No. 14/481,514, filed Sep. 9, 2014, 10 pages.
First Action Interview Office Action mailed on Jun. 30, 2016, issued in connection with U.S. Appl. No. 14/481,505, filed Sep. 9, 2014, 9 pages.
International Searching Authority, International Search Report and Written Opinion mailed on Nov. 23, 2015, issued in connection with International Application No. PCT/US2015/048942, filed Sep. 8, 2015, 14 pages.
International Searching Authority, International Search Report and Written Opinion mailed on Nov. 23, 2016, issued in connection with International Patent Application No. PCT/US2016/052266, filed Sep. 16, 2016, 11 pages.
"Denon 2003-2004 Product Catalog," Denon, 2003-2004, 44 pages.
Non-Final Office Action mailed on Jan. 4, 2017, issued in connection with U.S. Appl. No. 15/207,682, filed Jul. 12, 2016, 6 pages.
Non-Final Office Action mailed on Dec. 9, 2016, issued in connection with U.S. Appl. No. 14/678,248, filed Apr. 3, 2015, 22 pages.
Non-Final Office Action mailed on Jul. 13, 2016, issued in connection with U.S. Appl. No. 14/940,779, filed Nov. 13, 2015, 16 pages.
Non-Final Office Action mailed on Dec. 14, 2016, issued in connection with U.S. Appl. No. 14/481,505, filed Sep. 9, 2014, 19 pages.
Notice of Allowance mailed on Nov. 4, 2016, issued in connection with U.S. Appl. No. 14/481,514, filed Sep. 9, 2014, 10 pages.
Notice of Allowance mailed on Dec. 12, 2016, issued in connection with U.S. Appl. No. 14/805,140, filed Jul. 21, 2015, 24 pages.
Notice of Allowance mailed on Dec. 21, 2016, issued in connection with U.S. Appl. No. 14/682,182, filed Apr. 9, 2015, 8 pages.
Notice of Allowance mailed on Dec. 30, 2016, issued in connection with U.S. Appl. No. 14/696,014, filed Apr. 24, 2015, 13 pages.
Preinterview First Office Action mailed on May 17, 2016, issued in connection with U.S. Appl. No. 14/481,505, filed Sep. 9, 2014, 7 pages.
Preinterview First Office Action mailed on May 25, 2016, issued in connection with U.S. Appl. No. 14/481,514, filed Sep. 9, 2014, 7 pages.
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2003, entitled "Controlling and manipulating groupings in a multi-zone music or media system," 82 pages.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
Final Office Action mailed on Jan. 19, 2017, issued in connection with U.S. Appl. No. 14/940,779, filed Nov. 13, 2015, 15 pages.
Final Office Action mailed on Oct. 14, 2016, issued in connection with U.S. Appl. No. 14/682,182, filed Apr. 9, 2015, 16 pages.
Final Office Action mailed on Oct. 17, 2016, issued in connection with U.S. Appl. No. 14/678,248, filed Apr. 3, 2015, 22 pages.
Final Office Action mailed on Oct. 21, 2016, issued in connection with U.S. Appl. No. 14/696,014, filed Apr. 24, 2015, 13 pages.
Gonzalez et al., "Simultaneous Measurement of Multichannel Acoustic Systems," J. Audio Eng. Soc., 2004, pp. 26-42, vol. 52, No. 1/2.
International Bureau, International Preliminary Report on Patentability mailed on Sep. 29, 2016, issued in connection with International Application No. PCT/US2015/020993, filed on Mar. 17, 2015, 8 pages.
International Bureau, International Preliminary Report on Patentability mailed on Sep. 29, 2016, issued in connection with International Application No. PCT/US2015/021000, filed on Mar. 17, 2015, 9 pages.
International Searching Authority, International Search Report and Written Opinion mailed on Oct. 18, 2016, issued in connection with International Application No. PCT/US2016/043116, filed on Jul. 20, 2016, 14 pages.
International Searching Authority, International Search Report and Written Opinion mailed on Oct. 18, 2016, issued in connection with International Application No. PCT/US2016/043840, filed on Jul. 25, 2016, 14 pages.
International Searching Authority, International Search Report and Written Opinion mailed on Nov. 23, 2015, issued in connection with International Application No. PCT/US2015/048944, filed on Sep. 8, 2015, 12 pages.
International Searching Authority, International Search Report and Written Opinion mailed on Oct. 25, 2016, issued in connection with International Application No. PCT/US2016/043109, filed on Jul. 20, 2016, 12 pages.
Non-Final Office Action mailed on Feb. 3, 2016, issued in connection with U.S. Appl. No. 14/481,522, filed Sep. 9, 2014, 12 pages.
Non-Final Office Action mailed on Oct. 6, 2016, issued in connection with U.S. Appl. No. 14/678,263, filed Apr. 3, 2015, 30 pages.
Non-Final Office Action mailed on Sep. 7, 2016, issued in connection with U.S. Appl. No. 14/826,873, filed Aug. 14, 2015, 12 pages.
Non-Final Office Action mailed on Feb. 18, 2016, issued in connection with U.S. Appl. No. 14/644,136, filed Mar. 10, 2015, 10 pages.
Non-Final Office Action mailed on Oct. 25, 2016, issued in connection with U.S. Appl. No. 14/864,506, filed Sep. 24, 2015, 9 pages.
Notice of Allowance mailed on Nov. 2, 2016, issued in connection with U.S. Appl. No. 14/884,001, filed Oct. 15, 2015, 8 pages.
Notice of Allowance mailed on Nov. 9, 2016, issued in connection with U.S. Appl. No. 14/805,340, filed Jul. 21, 2015, 13 pages.
Notice of Allowance mailed on Sep. 16, 2016, issued in connection with U.S. Appl. No. 15/066,049, filed Mar. 10, 2016, 7 pages.
Notice of Allowance mailed on Aug. 19, 2016, issued in connection with U.S. Appl. No. 14/644,136, filed Mar. 10, 2015, 12 pages.

(56) References Cited

OTHER PUBLICATIONS

Notice of Allowance mailed on Sep. 23, 2016, issued in connection with U.S. Appl. No. 15/070,160, filed Mar. 15, 2016, 7 pages.
Notice of Allowance mailed on Oct. 25, 2016, issued in connection with U.S. Appl. No. 14/826,873, filed Aug. 14, 2015, 5 pages.
Notice of Allowance mailed on Oct. 26, 2016, issued in connection with U.S. Appl. No. 14/811,587, filed Jul. 28, 2015, 11 pages.
Notice of Allowance mailed on Jul. 29, 2016, issued in connection with U.S. Appl. No. 14/481,522, filed Sep. 9, 2014, 11 pages.
Preinterview First Office Action mailed on Oct. 6, 2016, issued in connection with U.S. Appl. No. 14/726,921, filed Jun. 1, 2015, 6 pages.
Supplemental Notice of Allowability mailed on Oct. 27, 2016, issued in connection with U.S. Appl. No. 14/481,511, filed Sep. 9, 2014, 6 pages.

\* cited by examiner

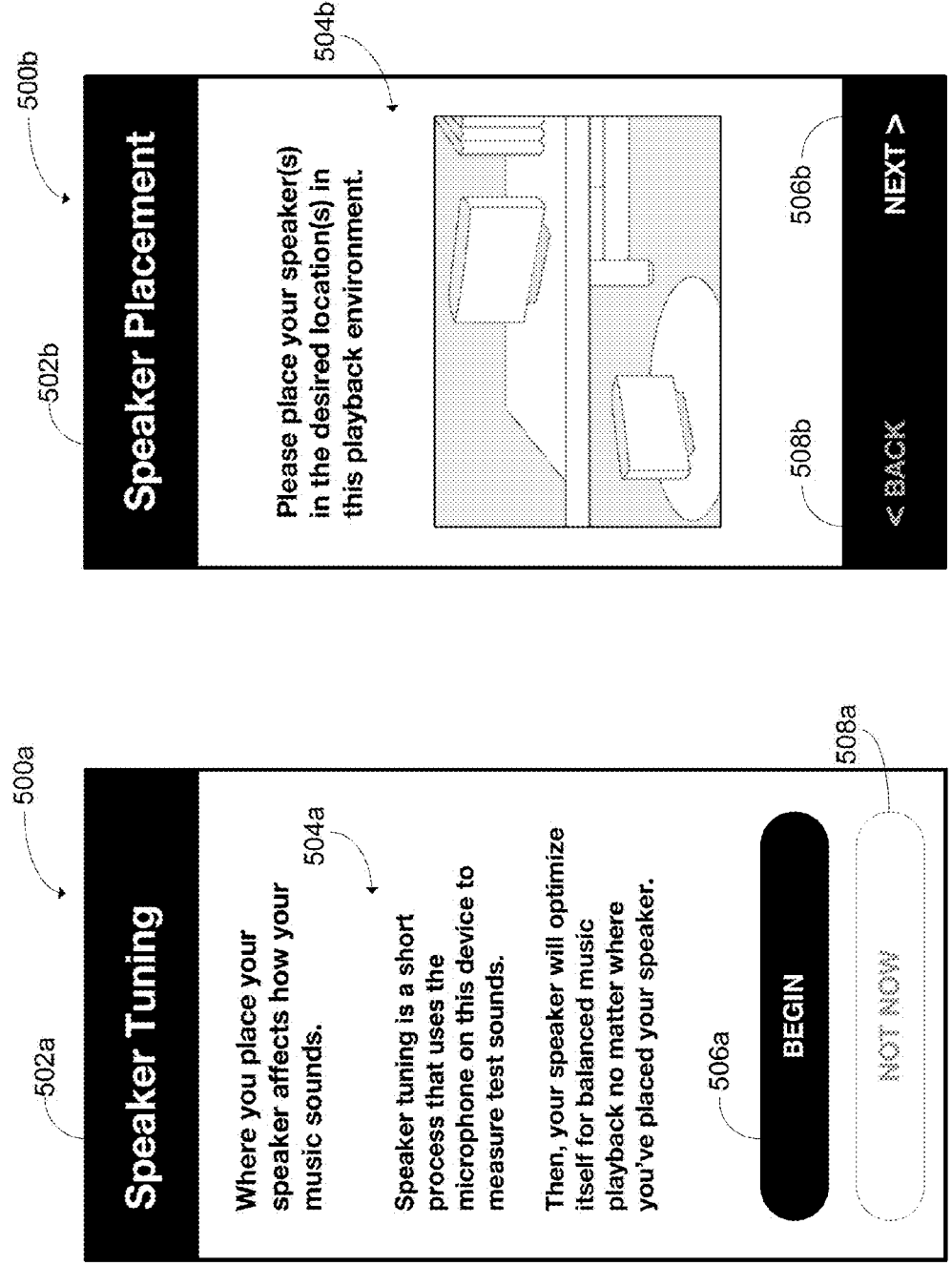

PLAYBACK DEVICE CALIBRATION USER INTERFACES

CROSS REFERENCE TO RELATED APPLICATIONS

This application is related to U.S. patent application Ser. No. 13/536,493 filed Jun. 28, 2012, entitled "System and Method for Device Playback Calibration," U.S. patent application Ser. No. 14/216,306 filed Mar. 17, 2014, entitled "Audio Settings Based On Environment," and U.S. patent application Ser. No. 14/481,511 filed Sep. 9, 2014, entitled "Playback Device Calibration," which are incorporated herein in their entirety. This application is a continuation-in-part of U.S. patent application Ser. No. 14/696,014 filed Apr. 24, 2015, entitled "Speaker Calibration," which is also incorporated herein in its entirety.

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from a plethora of sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

FIGS. 5A, 5B, 5C, 5D, 5E, and 5F show a first series of illustrative playback device calibration user interfaces;

Figure 1:
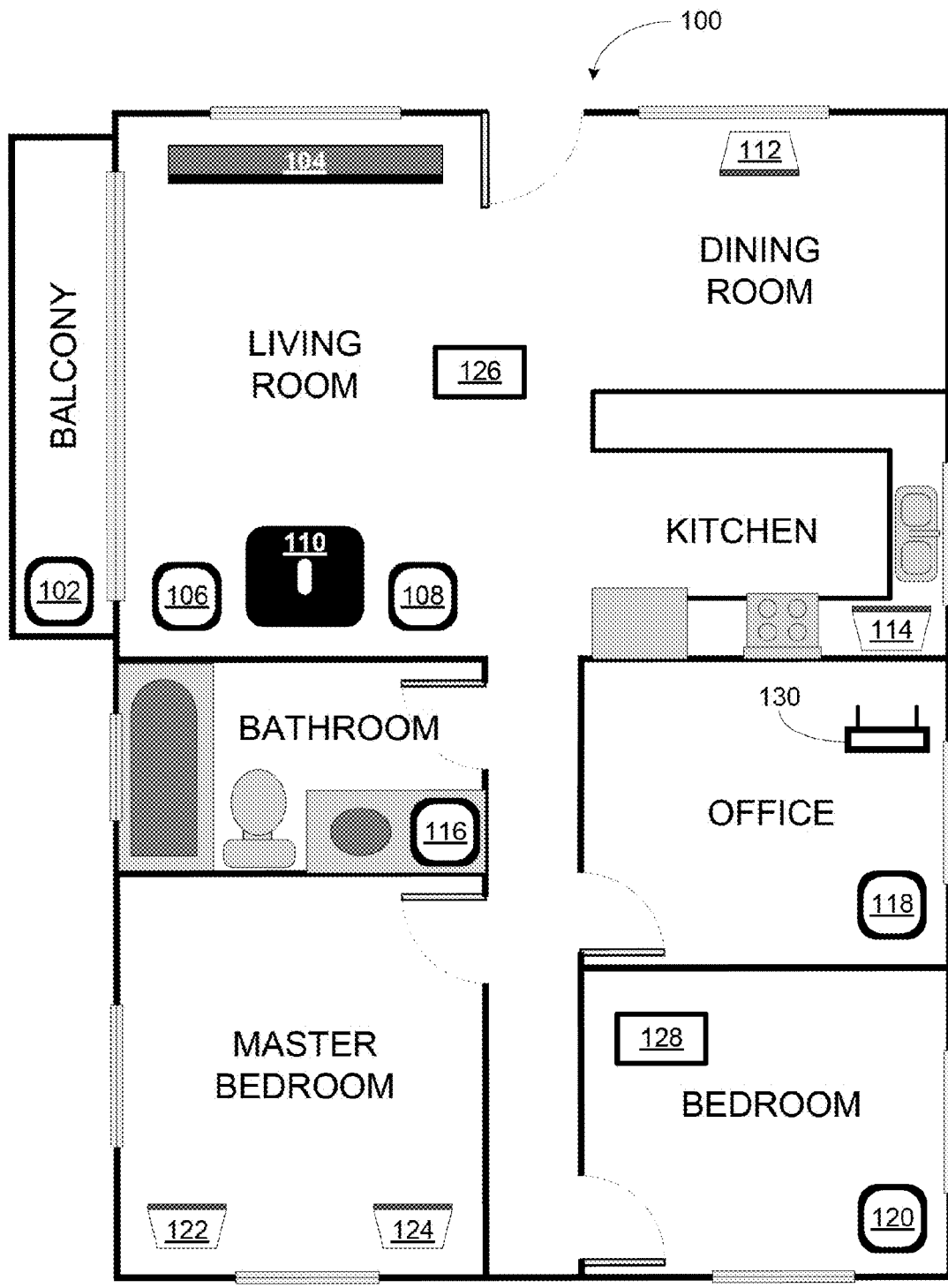
FIG. 1 shows an example media playback system configuration in which certain embodiments may be practiced.

The drawings are for the purpose of illustrating example embodiments, but it is understood that the inventions are not limited to the arrangements and instrumentality shown in the drawings.

DETAILED DESCRIPTION

I. Overview

In examples discussed herein, playback device calibration user interfaces may be provided to guide a user through a calibration process for one or more playback devices in a playback environment. Calibration of the one or more playback devices may provide a particular audio experience, accounting for position(s) of the one or more playback devices within the playback environment. The particular audio experience may be an audio experience as intended by artists of audio content when creating the audio content. Calibration of the one or more playback devices may involve the one or more playback devices playing a calibration tone and a network device concurrently detecting, via a microphone of the network device, an audio signal while the network device moves within the playback environment.

In one example, upon initiating calibration for one or more playback devices, the network device may provide a series of calibration interfaces to prepare and/or confirm that the one or more playback devices, the playback environment, and the network device are ready for the calibration process. In one instance, the series of calibration interfaces may provide an explanation on reasons the calibration may improve an audio experience within the playback environment. In another instance, the series of calibration interfaces may indicate whether a background noise level in the playback environment is low enough for calibration. In a further instance, the series of calibration interfaces may indicate a suitable orientation of the network device during movement within the playback environment and detection of the audio signal. In yet another instance, the series of calibration interfaces may provide a video demonstrating movement of the network device within the playback environment. Other examples are also possible.

Playback of the calibration tone and detection of the audio signal by the network device moving within the playback environment may be allocated a predetermined duration of time. Upon preparing and/or confirming that the one or more playback devices, the playback environment, and the network device are ready for the calibration process, the network device may provide on a calibration interface, an icon selectable to begin playback of the calibration tone by the one or more playback devices and detection of the audio signal by the network device. In one case, the calibration interface may further indicate the predetermined duration of time.

While the one or more playback devices play the calibration tone and the network device detects the audio signal, the network device may provide on a calibration interface a dynamic graphical representation indicating a remaining duration of the predetermined duration of time. The calibration interface may further provide a video, such as the demonstration video, to guide movement of the network device within the playback environment. The calibration interface may also provide a dynamic graphical representation of the audio signal as the audio signal is detected. The dynamic graphical representation of the detected audio signal may provide additional context to the calibration process.

In one example, the dynamic graphical representation of the audio signal may be in the form of a frequency response of the detected audio signal. As the network device continues to detect the audio signal over the predetermined duration of time, the graphical representation of the frequency response may be dynamically updated to show an updated frequency response of the detected audio signal. In one case, the frequency response may be provided along a concentric frequency axis. In one instance, a graphical representation of a corresponding remaining duration of the predetermined duration of time may also be provided along the concentric frequency axis, perhaps overlaying the graphical representation of the frequency response. Other examples are also possible.

After playback of the calibration tone by the one or more playback device and detection of the audio signal for the predetermined duration of time, playback of the calibration tone may be terminated, and a signal processing algorithm may be determined based on the detected audio signal. The signal processing algorithm may be determined such that the particular audio experience is provided by the one or more playback devices when applying the signal processing algorithm during audio playback. In one example, the network device may provide a calibration interface indicating that the signal processing algorithm is being determined.

The calibration interface indicating that the signal processing algorithm is being determined may include a pulsing or morphing graphical representation of the frequency response of the detected audio signal to indicate that the signal processing algorithm is being determined. In one case, the calibration interface may also include a textual message indicating that the signal processing algorithm is being determined. Other examples are also possible.

Once the signal processing algorithm has been determined, the network device may provide a calibration interface indicating that the signal processing algorithm has been determined. In one case, the calibration interface indicating that the signal processing algorithm has been determined may include a representation of a modified frequency response resulting from applying the determined signal processing algorithm to the frequency response determined based on the detected signal. In one instance, the representation of the modified frequency response may be in the form of a near-perfect circle about a concentric frequency axis. Other examples are also possible.

As indicated above, the present discussions involve playback device calibration user interfaces. In one aspect, a non-transitory computer-readable medium is provided. The non-transitory computer-readable medium has stored thereon instructions executable by a computing device to cause the computing device to perform functions comprising receiving audio data from a microphone for a predetermined duration of time, upon receiving a first subset of the audio data, generating first data configured to be displayed on a graphical display, the first data comprising, (i) a representation of a first frequency response based on at least the first subset of the audio data, and (ii) a representation of a first time within the predetermined duration of time, the first time corresponding to a time at which the first subset of audio data was received from the microphone, subsequently, upon receiving a second subset of the audio data, generating second data configured to be displayed on the graphical display, comprising (i) a representation of a second frequency response based on at least (a) the first subset of the audio data, and (b) the second subset of the audio data, and (ii) a representation of a second time within the predetermined duration of time, the second time corresponding to a time at which the second subset of audio data was received from the microphone.

In another aspect, a network device is provided. The network device includes a microphone, a processor, and memory configured for receiving audio data from the microphone for a predetermined duration of time, upon receiving a first subset of the audio data, generating first data configured to be displayed on a graphical display, comprising (i) a representation of a first frequency response based on at least the first subset of the audio data, and (ii) a representation of a first time within the predetermined duration of time, the first time corresponding to a time at which the first subset of audio data was received from the microphone, subsequently, upon receiving a second subset of the audio data, generating second data configured to be displayed on the graphical display, comprising (i) a representation of a second frequency response based on at least (a) the first subset of the audio data and (b) the second subset of the audio data, and (ii) a representation of a second time within the predetermined duration of time, the second time corresponding to a time at which the second subset of audio data was received from the microphone.

In a further aspect, a method is provided. The method involves receiving by a network device, audio data from a microphone for a predetermined duration of time, upon receiving a first subset of the audio data, generating, by the network device, first data configured to be displayed on a graphical display, comprising (i) a representation of a first frequency response based on at least the first subset of the audio data, and (ii) a representation of a first time within the predetermined duration of time, the first time corresponding to a time at which the first subset of audio data was received from the microphone, subsequently, upon receiving a second subset of the audio data, generating, by the network device, second data configured to be displayed on the graphical display, comprising (i) a representation of a second frequency response based on at least (a) the first subset of the audio data and (b) the second subset of the audio data, and (ii) a representation of a second time within the predetermined duration of time, the second time corresponding to a time at which the second subset of audio data was received from the microphone.

While some examples described herein may refer to functions performed by given actors such as "users" and/or other entities, it should be understood that this is for purposes of explanation only. The claims should not be interpreted to require action by any such example actor unless explicitly required by the language of the claims themselves. It will be understood by one of ordinary skill in the art that this disclosure includes numerous other embodiments.

II. Example Operating Environment

FIG. 1 shows an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102-124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
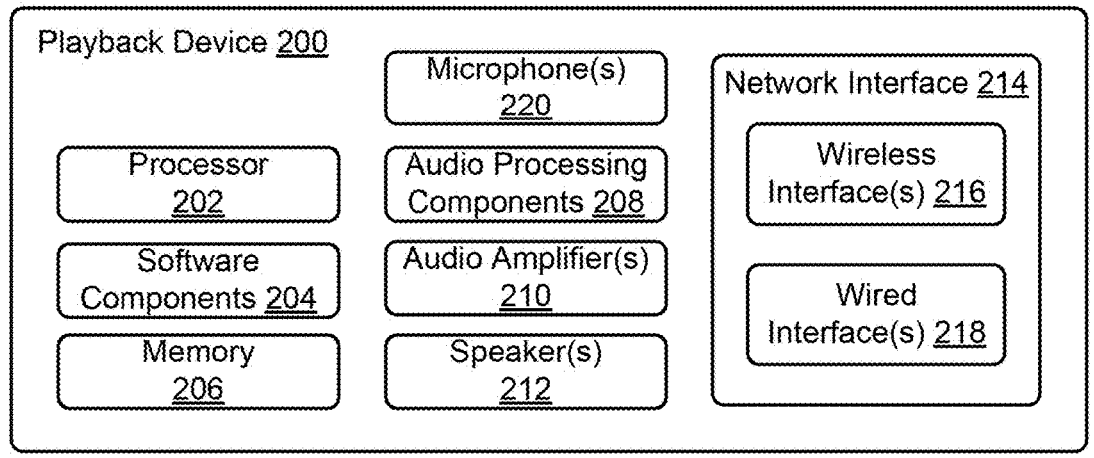
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, microphone(s) 220, and a network interface 214 including wireless interface(s) 216 and wired interface(s) 218. In one case, the playback device 200 may not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more of digital-to-analog converters (DAC), analog-to-digital converters (ADC), audio preprocessing components, audio enhancement components, and a digital signal processor (DSP), among others. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The microphone(s) 220 may include an audio sensor configured to convert detected sounds into electrical signals. The electrical signal may be processed by the audio processing components 208 and/or the processor 202. The microphone(s) 220 may be positioned in one or more orientations at one or more locations on the playback device 200. The microphone(s) 220 may be configured to detect sound within one or more frequency ranges. In one case, one or more of the microphone(s) 220 may be configured to detect sound within a frequency range of audio that the playback device 200 is capable or rendering. In another case, one or more of the microphone(s) 220 may be configured to detect sound within a frequency range audible to humans. Other examples are also possible.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being playing by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
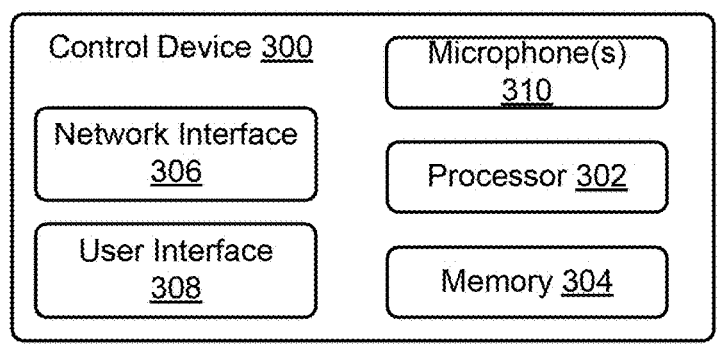
FIG. 3 shows a functional block diagram of an example control device.

FIG. 3 shows a functional block diagram of an example control device 300 that may be configured to be one or both of the control devices 126 and 128 of the media playback system 100. As shown, the control device 300 may include a processor 302, memory 304, a network interface 306, a user interface 308, and microphone(s) 310. In one example, the control device 300 may be a dedicated controller for the media playback system 100. In another example, the control device 300 may be a network device on which media playback system controller application software may be installed, such as for example, an iPhone™, iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be configured to store instructions executable by the processor 302 to perform those functions. The memory 304 may also be configured to store the media playback system controller application software and other data associated with the media playback system 100 and the user.

The microphone(s) 310 may include an audio sensor configured to convert detected sounds into electrical signals. The electrical signal may be processed by the processor 302. In one case, if the control device 300 is a device that may also be used as a means for voice communication or voice recording, one or more of the microphone(s) 310 may be a microphone for facilitating those functions. For instance, the one or more of the microphone(s) 310 may be configured to detect sound within a frequency range that a human is capable of producing and/or a frequency range audible to humans. Other examples are also possible.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Figure 4:
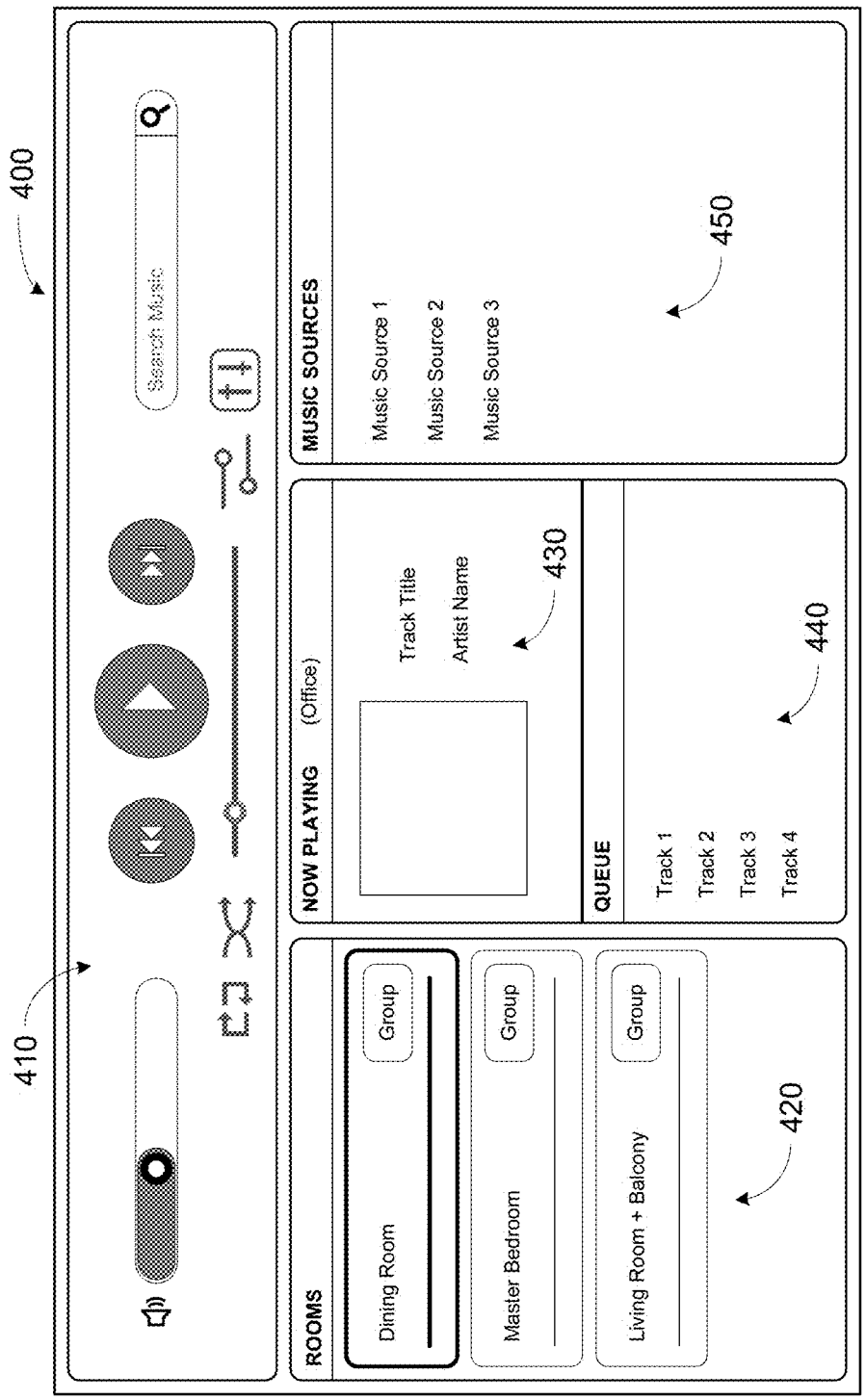
FIG. 4 shows an example controller interface.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The user interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g. according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

The above discussions relating to playback devices, control devices, playback zone configurations, and media item sources provide only some examples of operating environments within which functions and methods described below may be implemented. Other operating environments and configurations of media playback systems, playback devices, and network devices not explicitly described herein may also be applicable and suitable for implementation of the functions and methods.

III. Example Calibration User Interfaces Prior to Signal Detection

As previously discussed, playback device calibration user interfaces may be provided to guide a user through a calibration process for one or more playback devices in a playback environment. For instance, one or more of the playback devices 102-124 of FIG. 1, may be calibrated to provide a particular audio experience, while accounting for position(s) of the one or more playback devices within the playback environment. In one example, the playback device 118 as placed may be calibrated for the office zone. In another example, the playback devices 122 and 124 as placed may be calibrated for the master bedroom. Other examples are also possible.

The calibration interfaces may be provided on a network device to guide a user through the calibration process. The network device may be a device the user can use to control the one or more playback devices. For instance, the network device may be similar to the control devices 126 and 128 of FIG. 1, and 300 of FIG. 3. As such, the calibration interfaces may be provided on a graphical display associated with the user interface 308 of the control device 300. The calibration interfaces may be a component of a controller application, such as one providing the controller interface 400 of FIG. 4 for controlling the one or more playback devices.

In one case, the controller interface may provide the calibration user interfaces as a part of a setup procedure for the one or more playback devices. In another case, the controller application may provide the calibration user interfaces in response to an input indicating that at least one of the one or more playback devices are to be calibrated. In one instance, the input may be from a user of the controller application, indicating that the at least one playback device is to be calibrated. In another instance, the input may be a message from the at least one playback device, indicating that a placement of the at least one playback device has changed. Other examples are also possible.

FIG. 5A provides a calibration user interface 500a that may be provided in response to a determination that one or more playback devices are to be calibrated. As shown, the interface 500a includes a heading 502a, information 504a, a "begin" button 506a, and a "not now" button 508. The heading 502a indicates that the current interface 500a relates to "Speaker Tuning" while information 504a briefly describes the process and benefits of playback device calibration. As shown, information 504a indicates that a microphone of the network device will be used to measure calibration tones played by the one or more playback devices. The begin button 506a may be selectable to proceed to a next playback device calibration interface, such as an 500b of FIG. 5B, while the not now button 508a may be selectable to exit the playback device calibration process.

In one example, the microphone may be the microphone(s) 310 of the control device 300 shown in FIG. 3. While discussions herein generally refer to a microphone that is a component of the network device, one having ordinary skill in the art will appreciate that the microphone may alternatively be an external microphone communicatively coupled to the network device via a wired and/or wireless connection. In the case the microphone of the network device is an external microphone, one having ordinary skill in the art will appreciate that movement of the network device, as discussed herein, may additionally or alternatively involve movement of the external microphone.

Figures 5C, 5D:
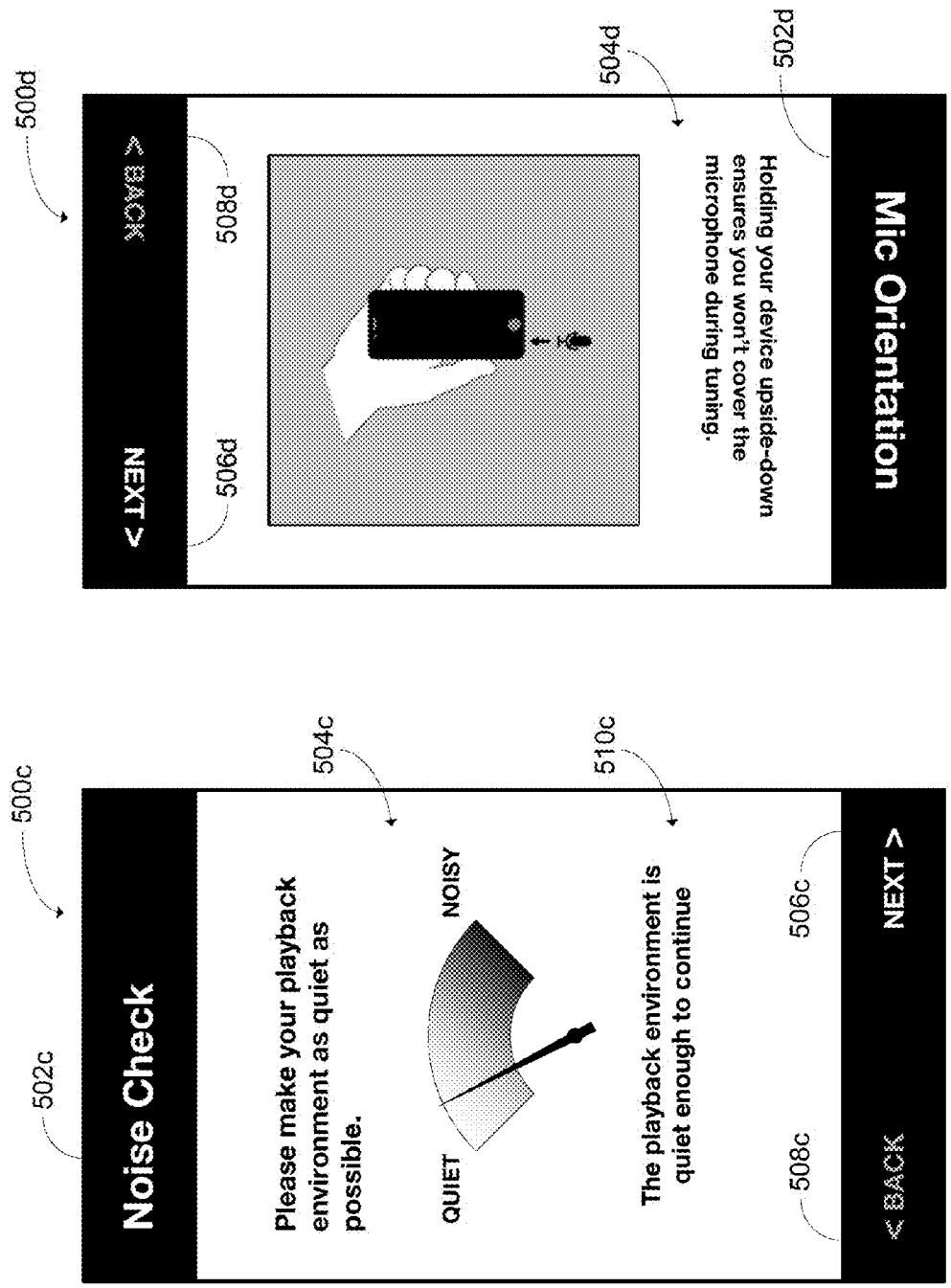

FIG. 5B shows the interface 500b, which includes a heading 502b, information 504b, a "back" button 508b, and a "next" button 506b. As shown, the heading 502b indicates that the interface 500b relates to "Speaker Placement" while information 504b suggests that the one or more playback devices being calibrated to be placed in their desired locations. The information 504b may also include one or more images showing example placements of playback devices. The next button 506b may be selectable to proceed to a next playback device calibration interface, such as an interface 500c of FIG. 5C, while the back button 508b may be selectable to return to a previous playback device calibration interface, such as interface 500a of FIG. 5A.

FIG. 5C shows the interface 500c, which includes a heading 502c, information 504c, supplemental information 510c, a "back" button 508c, and a "next" button 506c. The heading 502c indicates that the interface 500c relates to "Noise Check" while information 504c suggests that the playback environment of the one or more playback devices be made as quiet as possible. The information 504c may further include a graphical representation of a noise meter showing a noise level of the playback environment as detected by the network device. The supplemental information 510c may provide a message based on the detected noise level of the playback environment. In one example, as shown in FIG. 5C, if the noise level is sufficiently low, the supplemental information 510c may indicate that the playback environment is quiet enough to continue the calibration process. On the other hand, if the noise level is not sufficiently low, the supplemental information 510c may alternatively indicate that the playback environment is too noisy to continue the calibration process. In one case, the supplemental information 510c may further provide suggestions for reducing the noise level in the playback environment. The next button 506c may be selectable to proceed to a next playback device calibration interface, such as an interface 500d of FIG. 5D, while the back button 508c may be selectable to return to a previous playback device calibration interface, such as interface 500b of FIG. 5B.

FIG. 5D shows the interface 500d, which includes a heading 502c, information 504d, a "back" button 508d, and a "next" button 506d. The heading 502d indicates that the interface 500d relates to "Mic Orientation" while information 504d indicates that holding the network device in a particular manner, such as upside-down, ensures that the microphone is not obstructed during subsequent calibration tone measurements by the microphone. As shown, the information 504d may further include an image showing a network device being held upside-down. The next button 506d may be selectable to proceed to a next playback device calibration interface, such as an interface 500e of FIG. 5E, while the back button 508d may be selectable to return to a previous playback device calibration interface, such as interface 500c of FIG. 5C.

As shown in FIG. 5D, the interface 500d may be provided upside-down on the network device such that a user may responsively orient the network device upside-down. In one example, the interface 500d may be provided upside-down in response to a selection of the next button 508c of interface 500c. In another example, the interface 500d may be initially displayed right side-up in response to a selection of the next button 508c of interface 500c, and then subsequently rotated to the upside-down orientation to indicate that the network device is to be rotated upside-down. Other examples are also possible.

In one example, the interface 500d may or may not be provided by the network device based on a position of the microphone on the network device. For instance, the network device providing the interface 500d shown in FIG. 5D may be a network device that has a microphone positioned at the bottom of the network device. In this instance, the network device may be a mobile phone with a microphone positioned for optimal voice detection when the network device is used for phone calls. In another instance, if the network device has a microphone positioned at the top of the network device, the network device may not be configured to provide the user interface 500*d* because a regular upright orientation of the network device may better ensure that the microphone is not obstructed during the subsequent measurements than an upside-down orientation. In such a case, the next button 506*d* of the interface 500*d* may be selectable to proceed directly to a next playback device calibration interface 500*f*, bypassing the interface 500*d*.

Figures 5E, 5F:
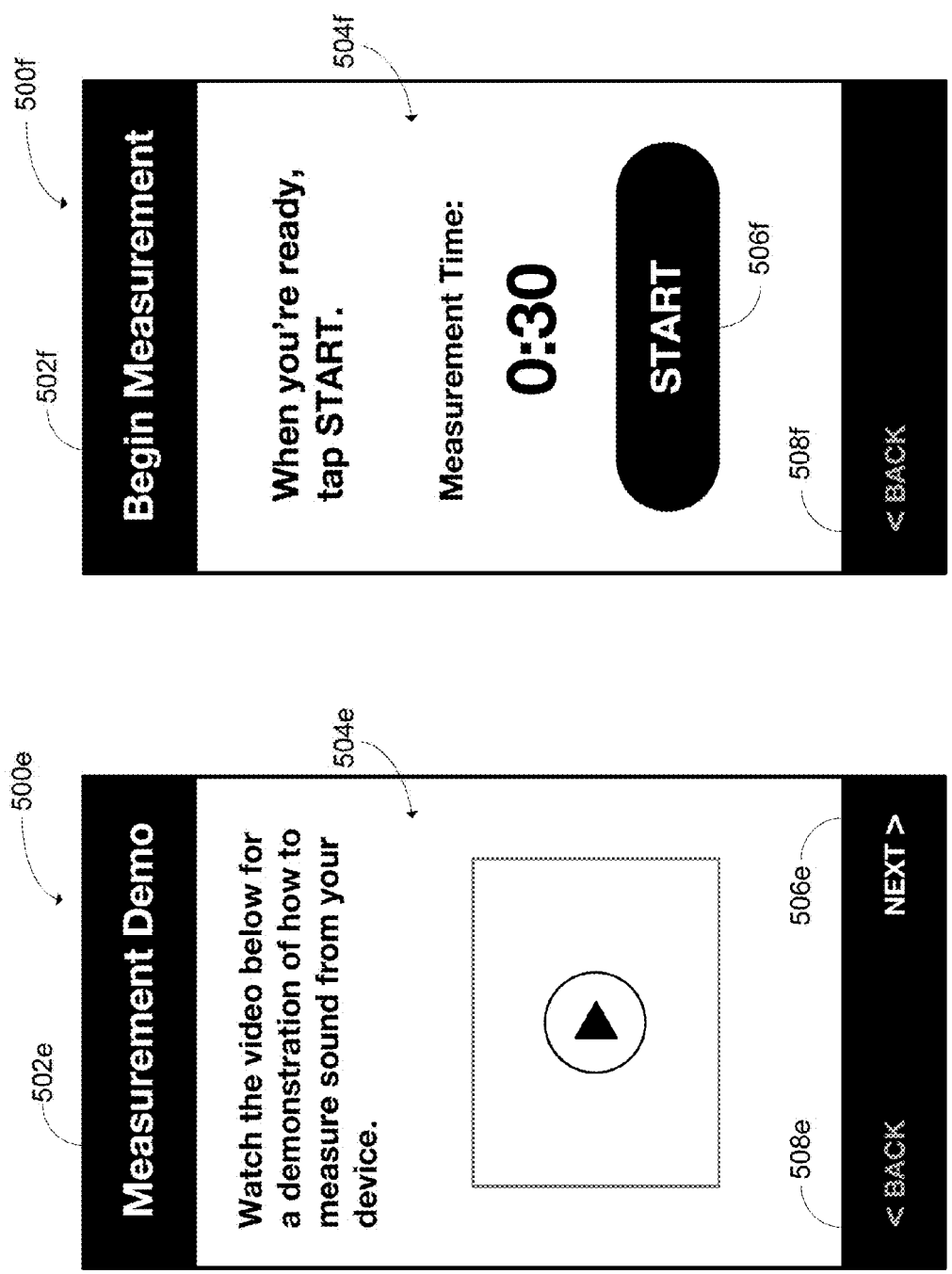
Figure 7B:
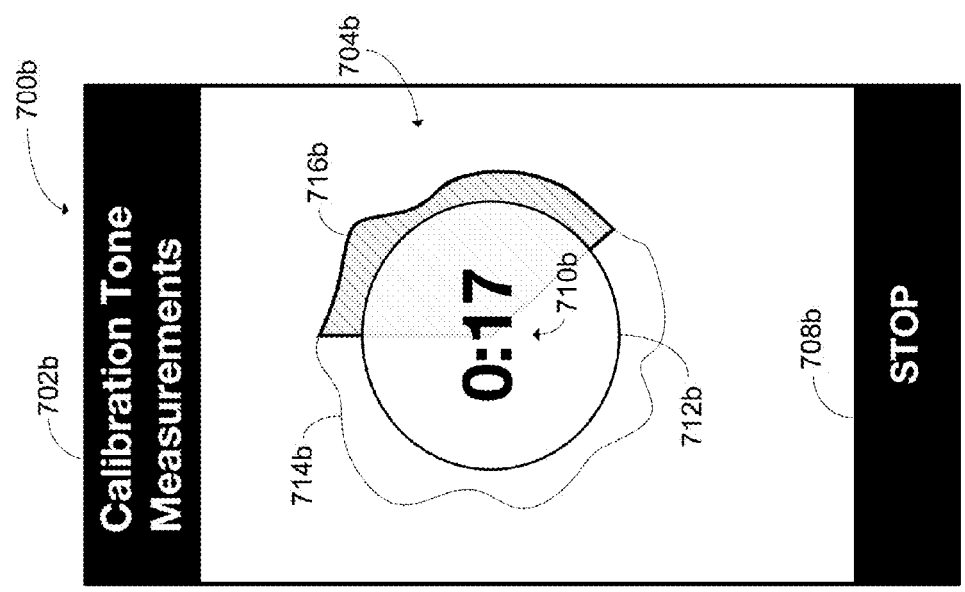
FIGS. 7A, 7B, 7C, and 7D show a second series of illustrative playback device calibration user interfaces.
Figure 7A:
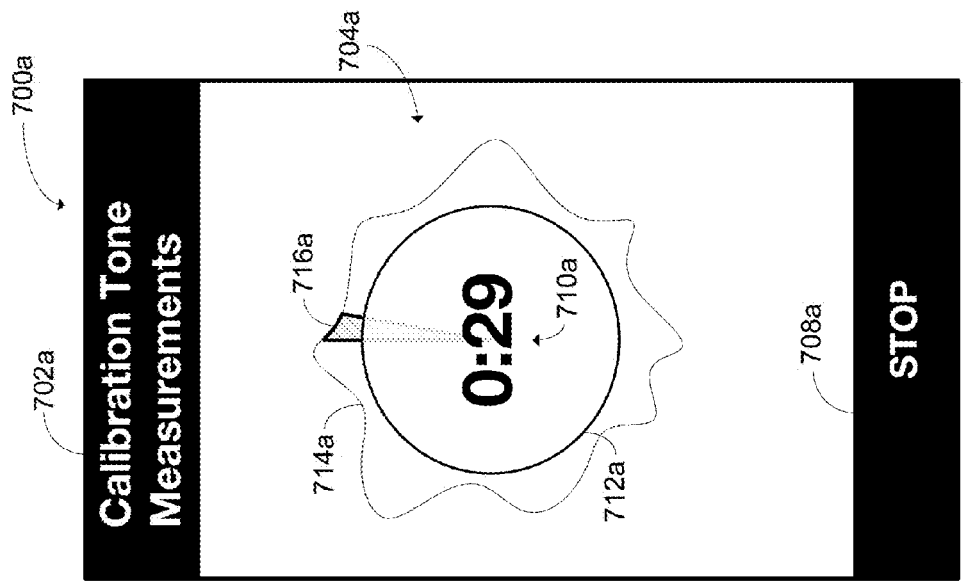

In the case the interface 500*d* is provided by the network device, subsequent interfaces, such as 500*e* of FIG. 5E, 500*f* of FIG. 5F, 700*a* of FIG. 7A, and 700*b* of FIG. 7B may also be provided upside-down. In one example, the network device may continue to provide the interfaces upside-down until at least the calibration tone measurements portion of the calibration process is complete. Other examples are also possible.

FIG. 5E shows the interface 500*e*, which includes a heading 502*e*, information 504*e*, a "back" button 508*e*, and a "next" button 506*e*. The heading 502*e* indicates that the interface 500*d* relates to "Measurement Demo" while information 504*e* suggests viewing of a video demonstrating the use of a network device to measure the calibration tone played by one or more playback devices. As shown in FIG. 5E, the demonstration video may be embedded within the information 504*e*. In one instance, the embedded video may be selectable to cause the video to be played (or replayed if playback of the video has ended). In another example, a link to the video may be provided. The next button 506*e* may be selectable to proceed to a next playback device calibration interface, such as interface 500*f* of FIG. 5F, while the back button 508*e* may be selectable to return to a previous playback device calibration interface, such as the interface 500*d* (or the interface 500*c*, if as indicated previously, the interface 500*d* is not provided).

The demonstration video may show a user moving within the playback environment while moving the network device up and down in space. Accordingly, the demonstration video may provide an example of how one might traverse the playback environment during the subsequent calibration tone measurements.

The provided demonstration video may vary based on a type and/or size of the playback environment. In one example, the type and/or size of the playback environment may be determined based on information gathered during setup of the one or more playback devices. In one case, during setup of the one or more playback devices, the playback environment associated with the one or more playback devices may be given a name "Living Room." In such a case, the demonstration video may show a user moving within an example living room. In another case, during setup of the one or more playback devices, the playback environment associated with the one or more playback device may be given a name "Study." In such a case, the demonstration video may show a user moving within an example office.

In another example, the type and/or size of the playback environment may be determined based on an indication of the type and/or size of the playback environment by a user of the network device during the calibration process. In one case, prior to providing the interface 500*e*, the network device may provide an interface to solicit the type and/or size of the playback environment. For instance, the interface may provide a list of playback environment types and/or a list of playback environment size ranges for selection. In another instance, the interface may allow entry of dimensions of the playback environment by the user. In yet another instance, the interface may suggest movement of the network devices between opposing border areas of the playback environment, and determine an approximate size of the playback environment based on a detected motion and/or path of the network device. Other examples are also possible.

FIG. 5F shows the interface 500*f*, which includes a heading 502*f*, information 504*f*, a "back" button 508*f*, and a "start" button 506*f*. The heading 502*f* indicates that the interface 500*f* relates to "Begin Measurement" while information 504*d* invites a selection of the start button 506*f* to begin measurements of the calibration tone. The information may further indicate a duration of time for the calibration tone measurements. The back button 508*f* may be selectable to return to a previous playback device calibration interface, such as the interface 500*e* of FIG. 5E. As indicated, the start button 506*f* may be selectable to begin measurements of the calibration tone.

The duration of time may be predetermined based on a number of audio samples suitable to determine an audio characteristic of the playback environment. Accordingly, the predetermined duration of time may vary based on a type and/or size of the playback environment. In one example, the type and/or size of the playback environment may be determined similarly to the determination of the type and/or size of the playback environment for the purpose of identifying the demonstration video to be provided by the interface 500*e* of FIG. 5E.

While the series of playback device calibration interfaces discussed above are provided in a particular order, one having ordinary skill in the art will appreciate that difference sequences of the interfaces may alternatively be provided. For example, the interface 500*d* of FIG. 5D may alternatively be provided after the interface 500*e* of FIG. 5E or before the interface 500*c* of FIG. 5C. In another example, the interface 500*c* of FIG. 5C may be provided after the interface 500*e* of FIG. 5E. Other examples are also possible.

IV. Providing Example Calibration User Interfaces During Signal Detection and Determination of Signal Processing Algorithm Continuing with the examples above, measurements of the calibration tone may be initiated in response to a selection of the start button 506*f* of FIG. 5F. Initiation of the calibration tone measurements may involve the network device transmitting, to the one or more playback device, a message to cause the one or more playback devices to begin playing the calibration tone.

In one example, audio data for the calibration tone may be already available on at least one of the one or more playback devices. In another example, the audio data may be available on the network device, and the message may further include a copy of the audio data or a URI or URL of the audio data on the network device. In yet another example, the audio data may be available on a remote server, and the message may indicate a URI or URL of the audio data for the one or more playback devices to retrieve. Retrieving the audio data may involve the one or more playback devices downloading the audio data from the remote server prior to playback of the calibration tone, or streaming the audio data from the remote server while playing the calibration tone. Other examples are also possible.

In one example, the message to cause the one or more playback devices to play the calibration tone may involve a command to add the calibration tone to a queue associated with the one or more playback devices. In one case, the calibration tone may be added as an additional item to the queue. In another case, the entire queue may be replaced with an instance of the calibration tone. In such a case, a playback mode of the queue containing the calibration tone may be set to a repeat mode. As such, the calibration tone may continue to be played if a duration of the calibration tone is shorter than the predetermined duration of time for calibration tone measurements.

In the case the entire queue is to be replaced with the calibration tone, items in the queue prior to the queue being replaced by the calibration tone may be automatically saved (i.e. as a playlist). In such a case, upon completed playback of the calibration tone for at least the predetermined duration of time, the calibration tone in the queue may be automatically replaced by the previous items in the queue. In other words, the queue associated with the one or more playback devices may be automatically restored upon completion of the calibration tone measurements. Other examples are also possible.

Figure 6:
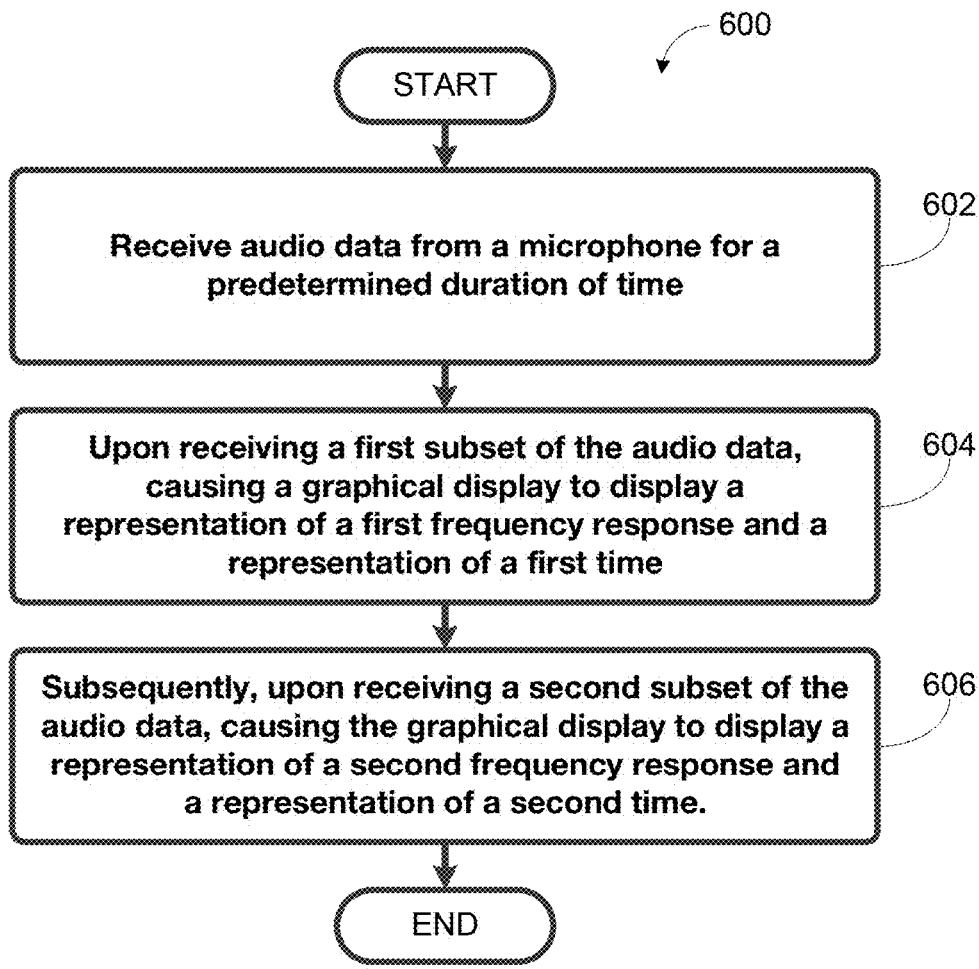
FIG. 6 shows a flow diagram of an example method for providing playback device calibration interfaces.

As indicated previously, the network device may provide playback device calibration user interfaces during the detection of the calibration tone. Interfaces provided during calibration tone measurement may provide an indication of a remaining duration of time for calibration tone measurements and/or additional context relating to the calibration tone measurements. FIG. 6 shows a flow diagram of an example method for providing a playback device calibration interface. Method 600 presents example methods that can be implemented within an operating environment involving, for example, the media playback system 100 of FIG. 1, one or more of the playback device 200 of FIG. 2, and one or more of the control device 300. In one example, the method 500 may be performed in whole or in part by a computing device in communication with a media playback system. For instance, the method 500 may be performed by one or more of the control devices 126 and 128 of FIG. 1. In such cases, one or more of the control devices 126 and 128 may have installed thereon a software application that includes instructions executable by a processor of a respective control device to cause the respective control device to perform the functions of method 500.

Method 600 may include one or more operations, functions, or actions as illustrated by one or more of blocks 602-606. Although the respective blocks are illustrated in sequential order, these blocks may also be performed in parallel, and/or in a different order than those described herein. Also, the various blocks may be combined into fewer blocks, divided into additional blocks, and/or removed based upon the desired implementation. In addition, for the method 500 and other processes and methods disclosed herein, the flowcharts show functionality and operation of only a few possible implementations of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive.

The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the method 600 and other processes and methods disclosed herein, each block may represent circuitry that is wired to perform the specific logical functions in the process.

As shown in FIG. 6, the method 600 involves receiving audio data from a microphone for a predetermined duration of time at block 602, upon receiving a first subset of the audio data, causing a graphical display to display a representation of a first frequency response and a representation of a first time at block 604, and subsequently, upon receiving a second subset of the audio data, causing the graphical display to display a representation of a second frequency response and a representation of a second time at block 606.

a. Receive Audio Data from a Microphone for a Predetermined Duration of Time

As indicated above, block 602 involves receiving audio data from a microphone for a predetermined duration of time. Continuing with the examples above, the microphone may be a microphone of the network device used for the playback device calibration process. In other words, the network device may be the network devices providing the playback device calibration user interfaces discussed herein.

In one example, upon causing the one or more playback devices to play the calibration tone, the microphone may be configured to detect audio signals within the playback environment, and output an audio data based on the detected audio signals. Accordingly, the detected audio data may include a background noise component and an audio signal component corresponding to the calibration tone that is being played.

In one case, the microphone may have an integrated analog-to-digital converter to convert the detected audio signal to the audio data. In another case, the microphone may provide the detected audio signal to an analog-to-digital converter of the network device, and the analog-to-digital convert may convert the detected audio signal to the audio data. Other examples are also possible.

As indicated previously, the predetermined duration of time may be based on a number of audio samples suitable to determine an audio characteristic of the playback environment. Accordingly, as discussed above in connection to FIG. 5F, the predetermined duration of time may be based on a type and/or size of the playback environment.

In another example, the duration of time may be variable instead of predetermined. For instance, the network device may be configured to receive the audio data until the network device determines that a sufficient number of audio samples for determining the audio characteristics of the playback environment has been received. In one case, an estimated duration of time may be determined based on the type and/or size of the playback environment and displayed on an interface similar to the interface 500f of FIG. 5F. In such a case, the network device may receive the audio data until a sufficient number of audio samples have been received, but still provide on the interface useful information for a user moving the network device within the playback environment.

In yet another example, the duration of time for calibration tone measurements may be adjusted based on movement of the network device (by the user). For instance, if the network device detects, via one or more motion sensors, that the network device is still moving according to that suggested for calibration tone measurements, the network device may determine that the playback environment has not yet been sufficiently traversed by the network device, and accordingly that additional time may be needed for calibration tone measurements. Other examples are also possible.

b. Upon Receiving a First Subset of the Audio Data, Causing a Graphical Display to Display a Representation of a First Frequency Response and a Representation of a First Time At block 604, the method 600 involves upon receiving a first subset of the audio data, causing a graphical display a representation of a first frequency response and a representation of a first time. In one example, the graphical display may be a part of the network device, such as a graphical display associated with user interface 308 of the control device 300 of FIG. 3. In another example, the graphical display may be an external display communicatively coupled to the network device on which the microphone used for calibration tone measurements is provided. Other examples are also possible.

In one example, causing the graphical display to display the representation of the first frequency response and the representation of the first time may involve generating first data configured to be displayed on the graphical display. The first data may accordingly indicate (i) the representation of the first frequency response and (ii) the representation of the first time within the predetermined duration of time. The first time may correspond to a time the first subset of audio data was received from the microphone.

The first frequency response may be determined based on at least the first subset of audio data. In one example, the first frequency response may be determined based on all audio data received up to the first time. For instance, if the first subset of audio data is sequentially the fourth subset of audio data received from the microphone since beginning calibration tone measurements, then the first frequency response may be determined based on the first subset of audio data and the three subsets of audio data received prior to the first subset of audio data.

In one example, the first frequency response may be determined locally by a processor of the network device, such as the processor 302 of the control device 300 of FIG. 3. The processor may then generate, based on the determined first frequency response, the data configured to be displayed on the graphical display.

In another example, the first frequency response may be determined by another computing device, such as a remote server. In one case, the network device may transmit to the computing device, at least the first subset of audio data received from the microphone. The network device may then receive from the computing device, data indicating the first frequency response.

FIG. 7A provides a calibration user interface 700a that may be provided in connection to block 604 of method 600. The interface 700a may be an iteration of an interface dynamically provided/updated since beginning calibration tone measurements. As shown, the interface 700a includes a heading 702a, graphical representation 704a, and a "stop" button 708a. The heading 702a indicates that the current interface 700a relates to "Calibration Tone Measurements," the graphical representation 704a includes representations of the first frequency response and the first time, and the stop button 708a may be selectable to terminate calibration tone measurements.

In this illustrative example, the graphical representation 704a includes a first representation 710a of the first time within the predetermined duration of time, a second representation 716a of the first time within the predetermined duration of time, a concentric frequency axis 712a, and a representation 714a of the first frequency response along the concentric frequency axis 712a.

As shown, the concentric frequency axis 712a may be in the form of a circle. As such, the representation 714a of the first frequency response along the concentric frequencies axis 712a may involve a circularly wrapped and enclosed representation of the first frequency response. Other example representations of a frequency axis and the first frequency response along the frequency axis are also possible.

As indicated above, the first time may correspond to the time the first subset of audio data was received from the microphone. In this illustrative example, the first representation 710a is a numeric representation of the first time. In this case, the first representation 710a indicates that "0:29" seconds remain for calibration tone measurements. In another example, the first representation 710a may alternatively indicate an elapsed calibration tone measurement time. For instance, the first representation 710a may indicate "0:01" or "0:01/0:30." In yet another example, the first representation 710a may alternatively indicate an estimated remaining duration of time, as discussed previously in the case the duration of time is variable instead of predetermined. Other examples are also possible.

In one example, the second representation 716a of the first time may be a graphical representation along the concentric frequency axis 712a that is proportional to an amount of the elapsed calibration tone measurements time out of the predetermined duration time (or the estimated remaining duration of time). In another example, the second representation 716a of the first time may be proportional to an amount of the remaining calibration tone measurements time out of the predetermined duration of time (or the estimated remaining duration of time).

In the illustrative example of FIG. 7A, the second representation 716a of the first time includes a shaded and outlined wedge within the enclosed representation 714a of the first frequency response. In this example, the size of the wedge within the enclosed representation 714a may correspond to an amount of elapsed calibration tone measurement time. For instance, the angle of the wedge shown in FIG. 7A may be approximately 12 degrees, which is 1/30 of 360 degrees, corresponding to 1 second out of the example predetermined duration of time of 30 seconds.

In another example, the second representation 716a may include the outlined portion of the wedge along the representation 714a of the first frequency response but not the shaded or outlined sides of the wedge. In a further example, the shaded and outlined wedge may be within the concentric frequency axis 712a instead of within the representation 714a of the first frequency response. In some other examples, the wedge may be either shaded or outlined, but not both. Other examples are also possible.

c. Subsequently, Upon Receiving a Second Subset of the Audio Data, Causing the Graphical Display to Display a Representation of a Second Frequency Response and a Representation of a Second Time At block 606, the method 600 involves subsequent to block 604, and upon receiving a second subset of the audio data, causing the graphical display to display a representation of a second frequency response and a representation of a second time. In one example, causing the graphical display to display the representation of the second frequency response and the representation of the second time may involve generating second data configured to be displayed on the graphical display. The second data may accordingly indicate (i) the representation of the second frequency response and (ii) the representation of the second time within the predetermined duration of time. The second time may correspond to a time the second subset of audio data was received from the microphone.

The second frequency response may be determined based on at least the first subset of the audio data and the second subset of the audio data. In one example, the second frequency response may be determined based on all audio data received up to the second time, thus including the first subset of the audio data. For instance, if the first subset of audio data is sequentially the fourth subset of audio data received from the microphone since beginning calibration tone measurements, as described previously, and the second subset of audio data is sequentially the forty-fifth subset of the audio data received from the microphone, then the second frequency response may be determined based on the first subset of audio data, the three subsets of audio data received prior to the first subset of audio data, the second subset of audio data, and the forty subsets of audio data received between the first subset of audio data and second subset of audio data. As with the first frequency response, the second frequency response may be determined locally by the processor of the network device or by another computing device (i.e. remote server).

FIG. 7B provides a calibration user interface 700b that may be provided in connection to block 606 of method 600. The interface 700b may be an iteration of an interface dynamically updated since the interface 700a of FIG. 7A. As shown, the interface 700b includes a heading 702b, graphical representation 704b, and a "stop" button 708b. The heading 702b, like the heading 702a of the interface 700a, indicates that the current interface 700b also relates to "Calibration Tone Measurements." The graphical representation 704b includes the representations of the second frequency response and the second time, and the stop button 708b may be selectable to terminate calibration tone measurements.

In this illustrative example, the graphical representation 704b includes a first representation 710b of the second time within the predetermined duration of time, a second representation 716b of the second time within the predetermined duration of time, a concentric frequency axis 712b, and a representation 714b of the second frequency response along the concentric frequency axis 712b.

As shown, the concentric frequency axis 712b may be in the same as the concentric frequency axis 712a of the interface 700a. Accordingly, the representation 714b of the second frequency response along the concentric frequencies axis 712b may involve a circularly wrapped and enclosed representation of the second frequency response. Other example representations of a frequency axis and the second frequency response along the frequency axis are also possible.

As indicated above, the second time may correspond to the time the second subset of audio data was received from the microphone. In this illustrative example, the first representation 710b of the second time is a numeric representation of the second time, similar to the numeric first representation 710a of the first time. In this case, the first representation 710b of the second time indicates that "0:17" seconds remain for calibration tone measurements. In another example, the first representation 710b of the second time may alternatively indicate an elapsed calibration tone measurement time. For instance, the first representation 710b may indicate "0:13" or "0:13/0:30." In yet another example, the first representation 710b may alternatively indicate an estimated remaining duration of time, as discussed previously in the case the duration of time is variable instead of predetermined. Other examples are also possible.

In one example, the second representation 716b of the second time, similar to the second representation 716a of the first time, may be a graphical representation along the concentric frequency axis 712b that is proportional to an amount of the elapsed calibration tone measurements time out of the predetermined duration time (or the estimated remaining duration of time). In another example, the second representation 716b of the second time may be proportional to an amount of the remaining calibration tone measurements time out of the predetermined duration of time (or the estimated remaining duration of time).

In the illustrative example of FIG. 7B, the second representation 716b of the second time includes a shaded and outlined wedge within the enclosed representation 714b of the second frequency response. In this example, the size of the wedge within the enclosed representation 714b may correspond to an amount of elapsed calibration tone measurement time. For instance, the angle of the wedge shown in FIG. 7B may be approximately 156 degrees, which is 13/30 of 360 degrees, corresponding to 13 seconds out of the example predetermined duration of time of 30 seconds.

In another example, the second representation 716b of the second time may include the outlined portion of the wedge along the representation 714b of the second frequency response but not the shaded or outlined sides of the wedge. In a further example, the shaded and outlined wedge may be within the concentric frequency axis 712b instead of within the representation 714b of the second frequency response. In some other examples, the wedge may be either shaded or outlined, but not both. Other examples are also possible.

As indicated, the graphical representations 704a and 704b of interfaces 700a and 700b, respectively, may be just two iterations of dynamically updated graphical representations provided during calibration tone measurements. In one example, the network device may update the graphical representations periodically, such as every second or every half second, as examples. In one instance, if the graphical representation is updated every second, and the sampling frequency of the audio data is 44.1 kHz, then the first iteration of the graphical representations provided by the network device may indicate a frequency response determined based on the first 44,100 audio data samples received from the microphone, the second iteration of the graphical representations may indicate a frequency response determined based on both the second 44,100 audio data samples and the first 44,100 audio data samples (i.e. the first 88,200 audio data samples) received from the microphone, and so on, until the predetermined (or variable) duration of time expires, as an example.

Further, the calibration tone measurement interfaces provided by the network device, such as the interfaces 700a and 700b, may additionally or alternatively include content other than the representations of the frequency responses and times. For instance, the calibration tone measurement interfaces may provide a video, such as a demonstration video (such as the demonstration video discussed in connection to interface 500e of FIG. 5E) to guide movement of the network device during calibration tone measurements. Other examples are also possible.

In one example, after the network device has received the audio data from the microphone for the predetermined duration of time, the network device may transmit to the one or more playback devices playing the calibration tone, a message to terminate playback of the calibration tone. In one case, the network device may transmit the message in response to a determination that measurement of the calibration tone is complete and/or that a sufficient number of audio samples have been received. In another case, the network device may transmit the message in response to a determination that the predetermined duration of time has elapsed since the network device previously sent the message to cause the one or more playback devices to play the calibration tone.

In another example, the previous message the network device sent to the one or more playback devices to cause the one or more playback devices to play the calibration tone may further indicate the predetermined duration of time. In such a case, the one or more playback devices may automatically terminate playback of the playback tone after playing the calibration tone for the indicated predetermined duration of time. Other examples are also possible.

After receiving the audio data from the microphone for the predetermined duration of time, the network device may determine a signal processing algorithm based on the received audio data and characteristics of a particular audio experience. In one example, the particular audio experience may be an audio experience as intended by artists of audio content when creating the audio content. As such, when applying the determined audio signal processing algorithm, the one or more playback devices in the playback environment, as positioned within the playback environment during the calibration tone measurements may provide the particular audio experience.

In one case, determining the signal processing algorithm may involve determining equalization parameters that may best approximate the characteristics of the particular audio experience when applied by the one or more playback device in the playback environment. In one example, a single signal processing algorithm may be determined for the one or more playback devices. In another example, a respective signal processing algorithm may be determined for each of the one or more playback devices. As with the first and second frequency responses discussed above, the signal processing algorithm may be determined locally by the processor of the network device or by another computing device (i.e. remote server).

Figures 7C, 7D:
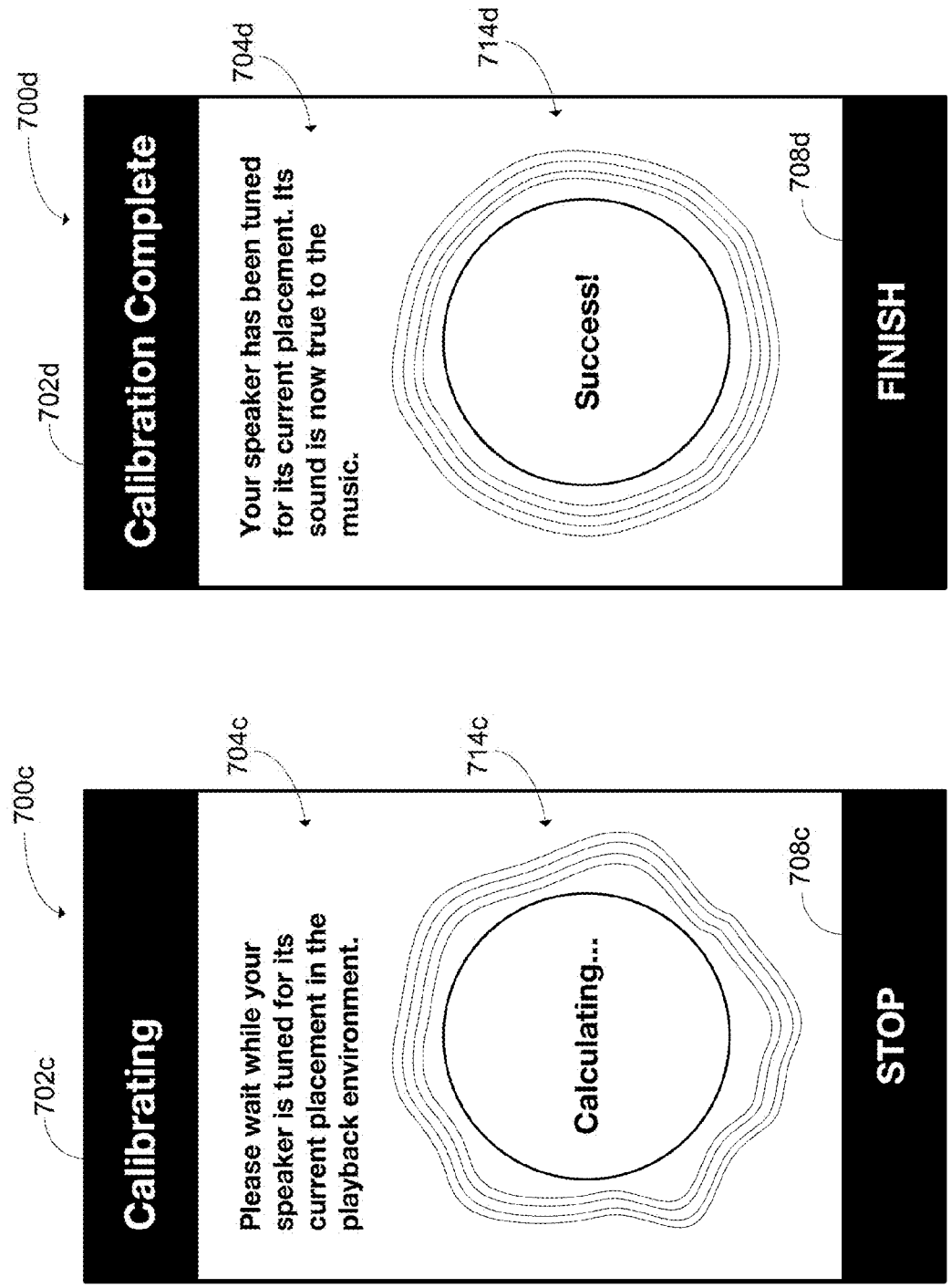

While the signal processing algorithm is being determined, the network device may generate for display on the graphical display, data indicating that the signal processing algorithm is being determined. FIG. 7C provides a calibration user interface 700c that may be provided while the signal processing algorithm is being determined. As shown, the interface 700c includes a heading 702c, textual information 704c, graphical representation 714c, and a "stop" button 708c. The heading 702c indicates that the current interface 700c relates to "Calibrating," the textual information 704c indicates that the one or more playback devices are being calibrated for their respective positions in the playback environment, and the stop button 708c may be selectable to terminate calibration of the one or more playback device.

The graphical representation 714c may include representations to further indicate that the signal processing algorithm is in the process of being determined (i.e. textual representation of "Calculating . . . "). The graphical representation 714c may further include a pulsing or morphing graphical representation of the frequency response of the received audio data. For instance, the graphical representation 714c may involve a periodic morphing between a straight line and the frequency response of the received audio data, or analogously, periodic morphing between a circle and a circularly wrapped and enclosed representation of the frequency response of the received audio data, as illustrated in FIG. 7C. Other examples are also possible.

Subsequent to the determination of the signal processing algorithm, the network device may generate for display on the graphical display, data indicating that the signal processing algorithm has been determined and that calibration of the one or more playback devices is complete. FIG. 7D provides a calibration user interface 700d that may be provided once the signal processing algorithm has been determined. As shown, the interface 700d includes a heading 702d, textual information 704d, graphical representation 714d, and a "finish" button 708d. The heading 702d indicates that the current interface 700c relates to "Calibration Complete," the textual information 704d indicates that the one or more playback devices has been calibrated for their respective positions in the playback environment, and the finish button 708d may be selectable to exit the completed calibration process of the one or more playback device.

The graphical representation 714d may include representations to further indicate that the signal processing algorithm has been determined (i.e. textual representation of "Success!"). The graphical representation 714d may further a representation of a modified frequency response resulting from applying the determined signal processing algorithm to the frequency response determined based on the received audio data. The graphical representation 714d may involve the representation of the modified frequency response in the form of a near-straight line along a straight line, or analogously, a near-perfect circle about a concentric frequency axis, as illustrated in FIG. 7D. Other examples are also possible.

Once the signal processing algorithm has been determined, data indicating the signal processing algorithm may be provided to the one or more playback devices. In one example, the network device may further provide an interface to prompt a selection of whether the one or more playback devices are to apply the determined signal processing algorithm. In one case, the interface may further prompt a selection of which of the one or more playback devices are to apply the determined signal processing algorithm, and/or when the one or more playback devices are to apply the determined signal processing algorithm. For instance, a selection may be made such that a subset of the one or more playback devices only apply the determined signal processing algorithm when the subset of the one or more playback devices are part of a group that includes each of the one or more playback devices in the playback environment. Other examples are also possible.

As indicated previously, the network device may provide the calibration user interfaces as a part of a setup procedure for the one or more playback device or alternatively in response to an input indicating that at least one of the one or more playback devices are to be calibrated. If the calibration user interfaces were provided as part of the setup procedure, subsequent portions of the setup procedure may be provided to continue the setup procedure, in response to a selection of the finish button 708d of FIG. 7D. If the calibration user interfaces were provided in response to an input indicating that at least one of the one or more playback devices are to be calibrated, the network device may, in response to a selection of the finish button 708d of Figure D, provide a portion of the controller interface that was provided immediately, or shortly before receiving the input indicating that at least one of the one or more playback devices are to be calibrated. Other examples are also possible.

V. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

(Feature 1) A network device, comprising a microphone, a processor; and memory configured for: receiving audio data from the microphone for a predetermined duration of time; upon receiving a first subset of the audio data, generating data configured to be displayed on a graphical display, comprising: (i) a representation of a first frequency response based on at least the first subset of the audio data; and (ii) a representation of a first time within the predetermined duration of time, the first time corresponding to a time at which the first subset of audio data was received from the microphone; subsequently, upon receiving a second subset of the audio data, generating data configured to be displayed on the graphical display, comprising: (i) a representation of a second frequency response based on at least (a) the first subset of the audio data and (b) the second subset of the audio data, and (ii) a representation of a second time within the predetermined duration of time, the second time corresponding to a time at which the second subset of audio data was received from the microphone.

(Feature 2) The network device of feature 1, wherein the representation of the first frequency response comprises a representation of the first frequency response along a concentric frequency axis.

(Feature 3) The network device of feature 1, wherein the representation of the first time within the predetermined duration of time comprises a representation of the first time within the predetermined duration of time along an axis of the representation of the first frequency response.

(Feature 4) The network device of feature 1, wherein the representation of the second time within the predetermined duration of time comprises a representation of the second time within the predetermined duration of time along an axis of the representation of the second frequency response.

(Feature 5) The network device of any of features 1 to 4, wherein generating the representation of the first frequency response comprises determining, by the network device, the first frequency response based on at least the first subset of the audio data, and generating, by the network device, the data configured to be displayed comprising the determined first frequency response.

(Feature 6) The network device of any of features 1 to 4, wherein generating the representation of the first frequency response comprises transmitting, by the network device, to a computing device, at least the first subset of the audio data, and receiving by the network device, from the computing device, data indicating the first frequency response.

(Feature 7) The network device of any of features 1 to 6, further configured for prior to receiving the audio data, receiving an input to initiate audio calibration of at least one playback device, and sending to the at least one playback device, a message to cause the at least one playback device to play a calibration tone, wherein the audio data comprises audio corresponding to the calibration tone.

(Feature 8) The network device of feature 7, further configured for after the predetermined duration of time, sending, to the at least one playback device, a message to terminate playback of the calibration tone.

(Feature 9) The network device of feature 7, wherein the message sent to the playback device to play the calibration tone indicates the predetermined duration of time for which the at least one playback device is to play the calibration tone.

(Feature 10) The network device of any of features 1 to 9, further configured for, prior to receiving the audio data, generating data configured to be displayed on the graphical display comprising an indication to orient the network device in a particular manner.

(Feature 11) The network device of any of claims 1 to 10, further configured for after receiving the audio data from the microphone for the predetermined duration of time, generating data for display on the graphical display including a graphical representation indicating that an audio signal processing algorithm is being determined, and subsequently, generating data for display on the graphical display including a representation of third frequency response by applying the audio signal processing algorithm to a frequency response of the audio data.

(Feature 12) A method comprising receiving, by a network device, audio data from a microphone for a predetermined duration of time; upon receiving a first subset of the audio data, generating, by the network device, data configured to be displayed on a graphical display, comprising: (i) a representation of a first frequency response based on at least the first subset of the audio data; and (ii) a representation of a first time within the predetermined duration of time, the first time corresponding to a time at which the first subset of audio data was received from the microphone; subsequently, upon receiving a second subset of the audio data, generating, by the network device, data configured to be displayed on the graphical display, comprising: (i) a representation of a second frequency response based on at least (a) the first subset of the audio data and (b) the second subset of the audio data, and (ii) a representation of a second time within the predetermined duration of time, the second time corresponding to a time at which the second subset of audio data was received from the microphone.

(Feature 13) The method of feature 12, wherein the representation of the first frequency response comprises a representation of the first frequency response along a concentric frequency axis.

(Feature 14) The method of feature 12, wherein the representation of the first time within the predetermined duration of time comprises a representation of the first time within the predetermined duration of time along an axis of the representation of the first frequency response.

(Feature 15) The method of feature 12, wherein the representation of the second time within the predetermined duration of time comprises a representation of the second time within the predetermined duration of time along an axis of the representation of the second frequency response.

(Feature 16) The method of any of features 12 to 15, wherein generating the representation of the first frequency response comprises determining, by the network device, the first frequency response based on at least the first subset of the audio data, and generating, by the network device, the data configured to be displayed comprising the determined first frequency response.

(Feature 17) The method of any of features 12 to 15, wherein generating the representation of the first frequency response comprises transmitting, by the network device, to a computing device, at least the first subset of the audio data, and receiving by the network device, from the computing device, data indicating the first frequency response.

(Feature 18) The method of any of features 12 to 17, further configured for prior to receiving the audio data, receiving an input to initiate audio calibration of at least one playback device, and sending to the at least one playback device, a message to cause the at least one playback device to play a calibration tone, wherein the audio data comprises audio corresponding to the calibration tone.

(Feature 19) The method of feature 18, further configured for after the predetermined duration of time, sending, to the at least one playback device, a message to terminate playback of the calibration tone.

(Feature 20) The method of feature 18, wherein the message sent to the playback device to play the calibration tone indicates the predetermined duration of time for which the at least one playback device is to play the calibration tone.

(Feature 21) The network device of any of features 12 to 20, further configured for, prior to receiving the audio data, generating data configured to be displayed on the graphical display comprising an indication to orient the network device in a particular manner.

(Feature 22) The network device of any of claims 12 to 21, further configured for after receiving the audio data from the microphone for the predetermined duration of time, generating data for display on the graphical display including a graphical representation indicating that an audio signal processing algorithm is being determined, and subsequently, generating data for display on the graphical display including a representation of third frequency response by applying the audio signal processing algorithm to a frequency response of the audio data.

(Feature 23) A computer readable medium configured for performing the method and functions of any of features 1 to 22.

The invention claimed is:

1. A non-transitory computer-readable medium having stored thereon instructions executable by a computing device to cause the computing device to perform functions comprising:
   receiving audio data continuously from a microphone for a predetermined duration of time;
   upon receiving a first subset of the audio data and while continuing to receive the audio data during the predetermined duration of time, generating first data configured to be displayed on a graphical display, the first data comprising:
      (i) a representation of a first frequency response based on at least the first subset of the audio data; and
      (ii) a representation of a first time within the predetermined duration of time, the first time corresponding to a time at which the first subset of audio data was received from the microphone;
   subsequently, upon receiving a second subset of the audio data and while continuing to receive the audio data during the predetermined duration of time, generating second data configured to be displayed on the graphical display, comprising:
      (i) a representation of a second frequency response based on at least (a) the first subset of the audio data, and (b) the second subset of the audio data; and
      (ii) a representation of a second time within the predetermined duration of time, the second time corresponding to a time at which the second subset of audio data was received from the microphone.

2. The non-transitory computer-readable medium of claim 1, wherein the representation of the first frequency response comprises a representation of the first frequency response along a concentric frequency axis.

3. The non-transitory computer-readable medium of claim 1, wherein the representation of the first time within the predetermined duration of time comprises a representation of the first time within the predetermined duration of time along an axis of the representation of the first frequency response.

4. The non-transitory computer-readable medium of claim 1, wherein the representation of the second time within the predetermined duration of time comprises a representation of the second time within the predetermined duration of time along an axis of the representation of the second frequency response.

5. The non-transitory computer-readable medium of claim 1, wherein generating the representation of the first frequency response comprises:
   determining, by the computing device, the first frequency response based on at least the first subset of the audio data; and
   generating, by the computing device, the first data configured to be displayed, the first data indicating the determined first frequency response.

6. The non-transitory computer-readable medium of claim 1, wherein generating the representation of the first frequency response comprises:
   transmitting, by the computing device, to a remote server, at least the first subset of the audio data; and
   receiving by the computing device, from the remote server, data indicating the first frequency response.

7. The non-transitory computer-readable medium of claim 1, further configured for:
   prior to receiving the audio data, receiving an input to initiate audio calibration of at least one playback device; and sending to at least one playback device, a message to cause the at least one playback device to play a calibration tone, wherein the audio data comprises audio corresponding to the calibration tone.

8. The non-transitory computer-readable medium of claim 7, further configured for after the predetermined duration of time, sending, to the at least one playback device, a message to terminate playback of the calibration tone.

9. The non-transitory computer-readable medium claim 7, wherein the message sent to the playback device to play the calibration tone indicates the predetermined duration of time for which the at least one playback device is to play the calibration tone.

10. The non-transitory computer-readable medium of claim 1, wherein the functions further comprise:
prior to receiving the audio data, generating data configured to be displayed on the graphical display comprising an indication to orient the computing device in a particular manner.

11. The non-transitory computer-readable medium of claim 1, wherein the functions further comprise:
after receiving the audio data from the microphone for the predetermined duration of time, generating data for display on the graphical display including a graphical representation indicating that an audio signal processing algorithm is being determined; and
subsequently, generating data for display on the graphical display including a representation of third frequency response by applying the audio signal processing algorithm to a frequency response of the audio data.

12. A network device, comprising:
a microphone;
a processor; and
memory configured for:
receiving audio data continuously from the microphone for a predetermined duration of time;
upon receiving a first subset of the audio data and while continuing to receive the audio data during the predetermined duration of time, generating first data configured to be displayed on a graphical display, comprising:
(i) a representation of a first frequency response based on at least the first subset of the audio data; and
(ii) a representation of a first time within the predetermined duration of time, the first time corresponding to a time at which the first subset of audio data was received from the microphone; and
subsequently, upon receiving a second subset of the audio data and while continuing to receive the audio data during the predetermined duration of time, generating second data configured to be displayed on the graphical display, comprising:
(i) a representation of a second frequency response based on at least (a) the first subset of the audio data and (b) the second subset of the audio data, and
(ii) a representation of a second time within the predetermined duration of time, the second time corresponding to a time at which the second subset of audio data was received from the microphone.

13. The network device of claim 12, wherein the representation of the first frequency response comprises a representation of the first frequency response along a concentric frequency axis.

14. The network device of claim 12, wherein the representation of the first time within the predetermined duration of time comprises a representation of the first time within the predetermined duration of time along an axis of the representation of the first frequency response.

15. The network device of claim 12, wherein the representation of the second time within the predetermined duration of time comprises a representation of the second time within the predetermined duration of time along an axis of the representation of the second frequency response.

16. The network device of any of claim 12, wherein generating the representation of the first frequency response comprises:
determining, by the network device, the first frequency response based on at least the first subset of the audio data; and
generating, by the network device, the first data configured to be displayed comprising the determined first frequency response.

17. A method comprising:
receiving by a network device, audio data continuously from a microphone for a predetermined duration of time;
upon receiving a first subset of the audio data and while continuing to receive the audio data during the predetermined duration of time, generating, by the network device, first data configured to be displayed on a graphical display, comprising:
(i) a representation of a first frequency response based on at least the first subset of the audio data; and
(ii) a representation of a first time within the predetermined duration of time, the first time corresponding to a time at which the first subset of audio data was received from the microphone; and
subsequently, upon receiving a second subset of the audio data and while continuing to receive the audio data during the predetermined duration of time, generating, by the network device, second data configured to be displayed on the graphical display, comprising:
(i) a representation of a second frequency response based on at least (a) the first subset of the audio data and (b) the second subset of the audio data, and (ii) a representation of a second time within the predetermined duration of time, the second time corresponding to a time at which the second subset of audio data was received from the microphone.

18. The method of claim 17, wherein the representation of the first frequency response comprises a representation of the first frequency response along a concentric frequency axis.

19. The method of claim 17, wherein the representation of the first time within the predetermined duration of time comprises a representation of the first time within the predetermined duration of time along an axis of the representation of the first frequency response.

20. The method of claim 17, wherein generating the representation of the first frequency response comprises:
determining, by the network device, the first frequency response based on at least the first subset of the audio data; and
generating, by the network device, the first data configured to be displayed, the data indicating the determined first frequency response.

* * * * *